(12) United States Patent
Lee et al.

(10) Patent No.: US 10,777,520 B2
(45) Date of Patent: Sep. 15, 2020

(54) SEMICONDUCTOR MEMORY DEVICE

(71) Applicant: SK hynix Inc., Gyeonggi-do (KR)

(72) Inventors: Go-Hyun Lee, Gyeonggi-do (KR); Jae-Taek Kim, Seoul (KR); Jun-Youp Kim, Gyeonggi-do (KR); Chang-Man Son, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/565,032

(22) Filed: Sep. 9, 2019

(65) Prior Publication Data
US 2020/0006270 A1 Jan. 2, 2020

Related U.S. Application Data

(63) Continuation-in-part of application No. 15/988,346, filed on May 24, 2018, now Pat. No. 10,446,570.

(30) Foreign Application Priority Data

Nov. 8, 2017 (KR) .................. 10-2017-0147873

(51) Int. Cl.
H01L 23/52 (2006.01)
H01L 23/00 (2006.01)
H01L 27/11519 (2017.01)
H01L 27/11524 (2017.01)
(Continued)

(52) U.S. Cl.
CPC .......... *H01L 24/09* (2013.01); *H01L 23/5226* (2013.01); *H01L 24/49* (2013.01);
(Continued)

(58) Field of Classification Search
CPC ......... H01L 27/10897; H01L 27/11573; H01L 23/564; H01L 23/562
See application file for complete search history.

(56) References Cited

U.S. PATENT DOCUMENTS 7,002,239 B1 * 2/2006 Nadarajah ......... H01L 23/49541
257/666
7,208,790 B2 * 4/2007 Arai ...................... H01L 27/105
257/296
(Continued)

FOREIGN PATENT DOCUMENTS

KR 10-2016-0136919 11/2016
KR 10-2017-0061247 6/2017

Primary Examiner — Nicholas J Tobergte
(74) Attorney, Agent, or Firm — IP & T Group LLP

(57) ABSTRACT

A semiconductor memory device includes a circuit chip including a first substrate, peripheral circuit elements which are defined on the first substrate and a first dielectric layer which covers the peripheral circuit elements, and having first pads which are coupled to the peripheral circuit elements, on one surface thereof; a memory chip including a second substrate which is disposed on a base dielectric layer, a memory cell array which is defined on the second substrate and a second dielectric layer which covers the memory cell array, and having second pads which are coupled with the first pads, on one surface thereof which is bonded with the one surface of the circuit chip; a contact passing through the base dielectric layer and the second dielectric layer; and one or more dummy contacts passing through the base dielectric layer and the second dielectric layer, and disposed around the contact.

20 Claims, 35 Drawing Sheets

(51) Int. Cl.
*H01L 27/11529* (2017.01)
*H01L 27/11556* (2017.01)
*H01L 27/1157* (2017.01)
*H01L 27/11573* (2017.01)
*H01L 27/11582* (2017.01)
*H01L 23/522* (2006.01)
*H01L 27/11565* (2017.01)
*H01L 27/108* (2006.01)

(52) U.S. Cl.
CPC .... *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01); *H01L 23/562* (2013.01); *H01L 23/564* (2013.01); *H01L 27/10897* (2013.01)

(56) References Cited

U.S. PATENT DOCUMENTS

| | | | | |
|---|---|---|---|---|
| 7,960,844 | B2* | 6/2011 | Jang | H01L 27/11578 257/777 |
| 8,013,383 | B2* | 9/2011 | Kidoh | H01L 27/0688 257/324 |
| 8,822,285 | B2* | 9/2014 | Hwang | H01L 27/11551 438/257 |
| 9,425,208 | B2* | 8/2016 | Kim | H01L 27/11582 |
| 9,484,355 | B2* | 11/2016 | Jung | H01L 27/11573 |
| 2015/0372005 | A1* | 12/2015 | Yon | H01L 27/11582 257/5 |
| 2016/0027796 | A1* | 1/2016 | Yang | H01L 27/11573 257/314 |
| 2019/0035733 | A1* | 1/2019 | Park | H01L 27/11582 |

* cited by examiner

SEMICONDUCTOR MEMORY DEVICE

CROSS-REFERENCE TO RELATED APPLICATION

This application is a continuation-in-part of U.S. application Ser. No. 15/988,346 filed on May 24, 2018, which claims priority under 35 USC § 119 to Korean Patent Application No. 10-2017-0147873 filed on Nov. 8, 2017, in the Korean Intellectual Property Office, the disclosures of which are incorporated herein in their entirety by reference.

BACKGROUND

1. Technical Field

Various embodiments generally relate to a semiconductor memory device and, more particularly, to a three-dimensional semiconductor memory device.

2. Related Art

As efforts for improving the degree of integration of a semiconductor memory device with a two-dimensional structure in which memory cells are formed in a single layer on a substrate reach a limit, a semiconductor memory device with a three-dimensional structure in which memory cells are disposed in a direction perpendicular to the top surface of a substrate to improve the degree of integration has been suggested.

SUMMARY

In an embodiment, a semiconductor memory device may include a circuit chip and a memory chip. The circuit chip may include a first substrate, peripheral circuit elements which are defined on the first substrate, a first dielectric layer which covers the peripheral circuit elements, and a plurality of first pads which are coupled to the peripheral circuit elements, on one surface thereof. The memory chip may include a second substrate which is disposed on a base dielectric layer, a memory cell array which is defined on the second substrate, a second dielectric layer which covers the memory cell array, and a plurality of second pads which are coupled with the first pads, on one surface thereof which is bonded with the one surface of the circuit chip. The semiconductor memory device may include a contact passing through the base dielectric layer and the second dielectric layer; and one or more dummy contacts passing through the base dielectric layer and the second dielectric layer, and disposed around the contact.

In an embodiment, a semiconductor memory device may include: peripheral circuit elements defined on a first substrate; a first dielectric layer covering the peripheral circuit elements; a plurality of first pads exposed at a top surface of the first dielectric layer, and coupled with the peripheral circuit elements; a second substrate disposed on a base dielectric layer; a memory cell array defined on the second substrate; a second dielectric layer covering the second substrate and the memory cell array; a third dielectric layer disposed on the second dielectric layer, and having one surface which is bonded with the top surface of the first dielectric layer; a plurality of second pads exposed at the one surface of the third dielectric layer, and coupled with the first pads; a contact passing through the base dielectric layer and the second dielectric layer; and one or more dummy contacts passing through the base dielectric layer and the second dielectric layer, and disposed around the contact. These and other features and advantages of the present invention will become apparent to those skilled in the art of the invention from the following detailed description of preferred embodiments in conjunction with the accompanying drawings.

DETAILED DESCRIPTION

Hereinafter, a semiconductor memory device will be described below with reference to the accompanying drawings through various examples of embodiments.

Figure 1:
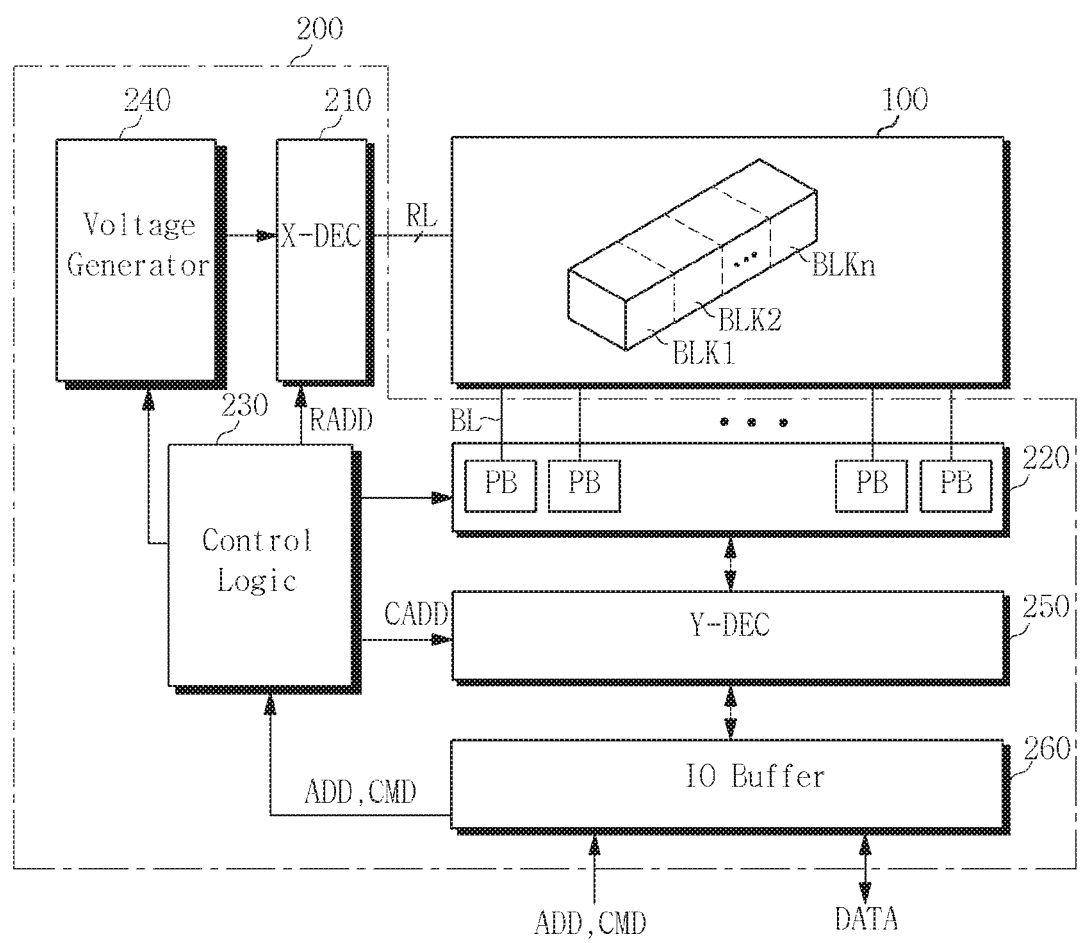
FIG. 1 is a block diagram illustrating a representation of an example of a semiconductor memory device in accordance with an embodiment of the present invention.

FIG. 1 is a block diagram illustrating a representation of an example of a semiconductor memory device in accordance with an embodiment of the present invention.

Referring to FIG. 1, the semiconductor memory device in accordance with the embodiment may include a memory cell array 100 and a peripheral circuit 200. The peripheral circuit 200 may include a row decoder 210, a page buffer circuit 220, a control logic 230, a voltage generator 240, a column decoder 250 and an input/output buffer 260.

The memory cell array 100 may include a plurality of memory blocks BLK1 to BLKn. Each of the memory blocks BLK1 to BLKn may include a plurality of cell strings. Each of the cell strings may include a plurality of memory cells which are stacked on a substrate. The memory cells may be nonvolatile memory cells.

The memory cell array 100 may be coupled to the row decoder 210 through row lines RL. The row lines RL may include at least one drain select line, a plurality of word lines and at least one source select line. The memory cell array 100 may be coupled to the page buffer circuit 220 through bit lines BL. The row lines RL may be coupled to the respective memory blocks BLK1 to BLKn. The bit lines BL may be coupled in common to the plurality of memory blocks BLK1 to BLKn.

The row decoder 210 may select any one among the memory blocks BLK1 to BLKn of the memory cell array 100, in response to a row address RADD provided from the control logic 230. The row decoder 210 may transfer operation voltages from the voltage generator 240, for example, a program voltage (Vpgm), a pass voltage (Vpass) and a read voltage (Vread), to the row lines RL coupled to a selected memory block.

The page buffer circuit 220 may include a plurality of page buffers PB which are coupled to the memory cell array 100 through the bit lines BL. The page buffers PB may operate as write drivers or sense amplifiers depending on an operation mode. In a program operation, the page buffers PB may latch data DATA received through the input/output buffer 260 and the column decoder 250 and apply voltages necessary for storing the data DATA in selected memory cells, to the bit lines BL in response to a control signal from the control logic 230. In a read operation, the page buffers PB may read data DATA stored in selected memory cells, through the bit lines BL and output the read data DATA to an exterior through the column decoder 250 and the input/output buffer 260. In an erase operation, the page buffers PB may float the bit lines BL.

The control logic 230 may output a row address RADD of an address ADD received through the input/output buffer 260, to the row decoder 210, and output a column address CADD of the address ADD to the column decoder 250. The control logic 230 may control the page buffer circuit 220 and the voltage generator 240 to access selected memory cells, in response to a command CMD received through the input/output buffer 260.

The voltage generator 240 may generate various voltages required in the semiconductor memory device. For example, the voltage generator 240 may generate a program voltage, a pass voltage, a select read voltage and an unselect read voltage.

The column decoder 250 may input program data to the page buffer circuit 220 in response to a column address CADD from the control logic 230.

Figure 2:
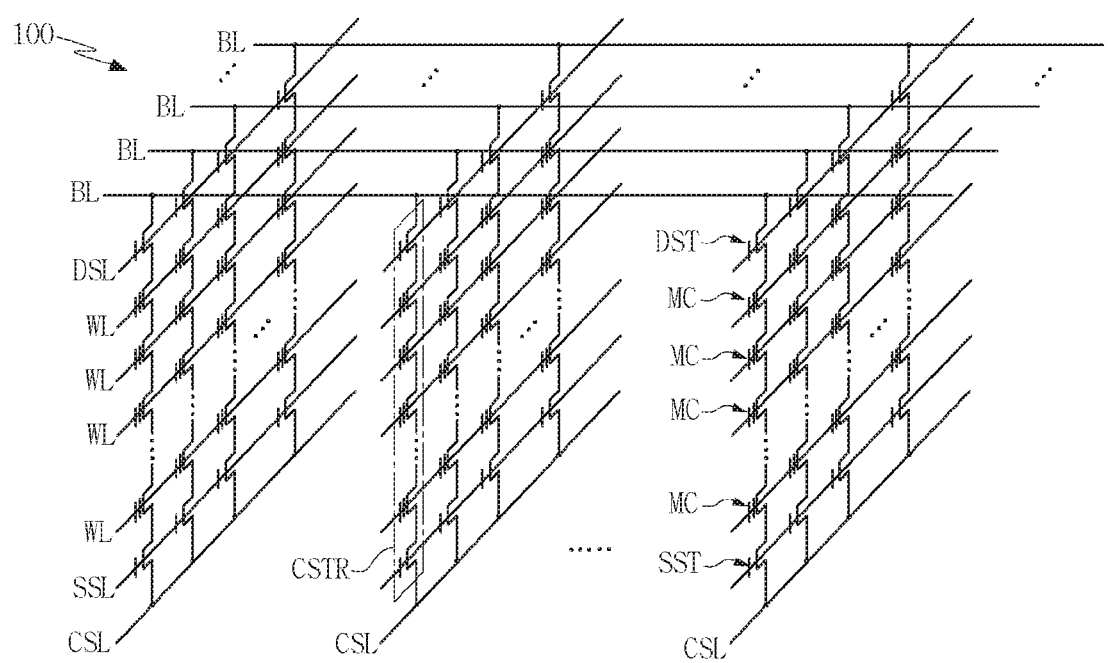
FIG. 2 is an equivalent circuit diagram illustrating a representation of an example of a memory cell array shown in FIG. 1.

FIG. 2 is an equivalent circuit diagram illustrating a representation of an example of the memory cell array shown in FIG. 1.

Referring to FIG. 2, the memory cell array 100 may include a plurality of cell strings CSTR which are coupled between a plurality of bit lines BL and a plurality of common source lines CSL.

Each of the cell strings CSTR may include a drain select transistor DST, a plurality of memory cells MC and a source select transistor SST which are coupled in series between a corresponding bit line BL and a corresponding common source line CSL.

Source select lines SSL, a plurality of word lines WL and drain select lines DSL may be provided between the common source lines CSL and the bit lines BL. The gate of the source select transistor SST may be coupled to a source select line SSL. The gates of the memory cells MC may be coupled to corresponding word lines WL, respectively. The gate of the drain select transistor DST may be coupled to a drain select line DSL.

The source of the source select transistor SST may be coupled to a corresponding common source line CSL. The drain of the source select transistor SST may be coupled to the source of the lowermost memory cell MC. The source of the drain select transistor DST may be coupled to the drain of the uppermost memory cell MC. The drain of the drain select transistor DST may be coupled to a corresponding bit line BL.

While FIG. 2 illustrates a structure in which each cell string CSTR includes one drain select transistor DST and one source select transistor SST, it is to be noted that the embodiment is not limited thereto and each cell string CSTR may include a plurality of drain select transistors DST or/and a plurality of source select transistors SST.

If a signal is applied to the gate of the drain select transistor DST through the drain select line DSL, a signal applied through the bit line BL is transferred to the memory cells MC which are coupled in series, by which a data read or write operation may be performed. If a signal is applied to the gate of the source select transistor SST through the source select line SSL, an erase operation of erasing all the data stored in the memory cells MC may be performed.

Hereinbelow, in the accompanying drawings, a direction perpendicular to the top surface of a substrate is defined as a first direction FD, and two directions parallel to the top surface of the substrate and intersecting with each other are defined as a second direction SD and a third direction TD, respectively. The substrate may correspond to a first substrate (the reference numeral 310 of FIG. 4) or a second substrate (the reference numeral 410 of FIG. 4) which will be described below. The second direction SD may correspond to the extending direction of word lines, and the third direction TD may correspond to the extending direction of bit lines. The second direction SD and the third direction TD may intersect substantially perpendicularly with each other. In the drawings, a direction indicated by an arrow and a direction opposite thereto represent the same direction.

Figure 3:
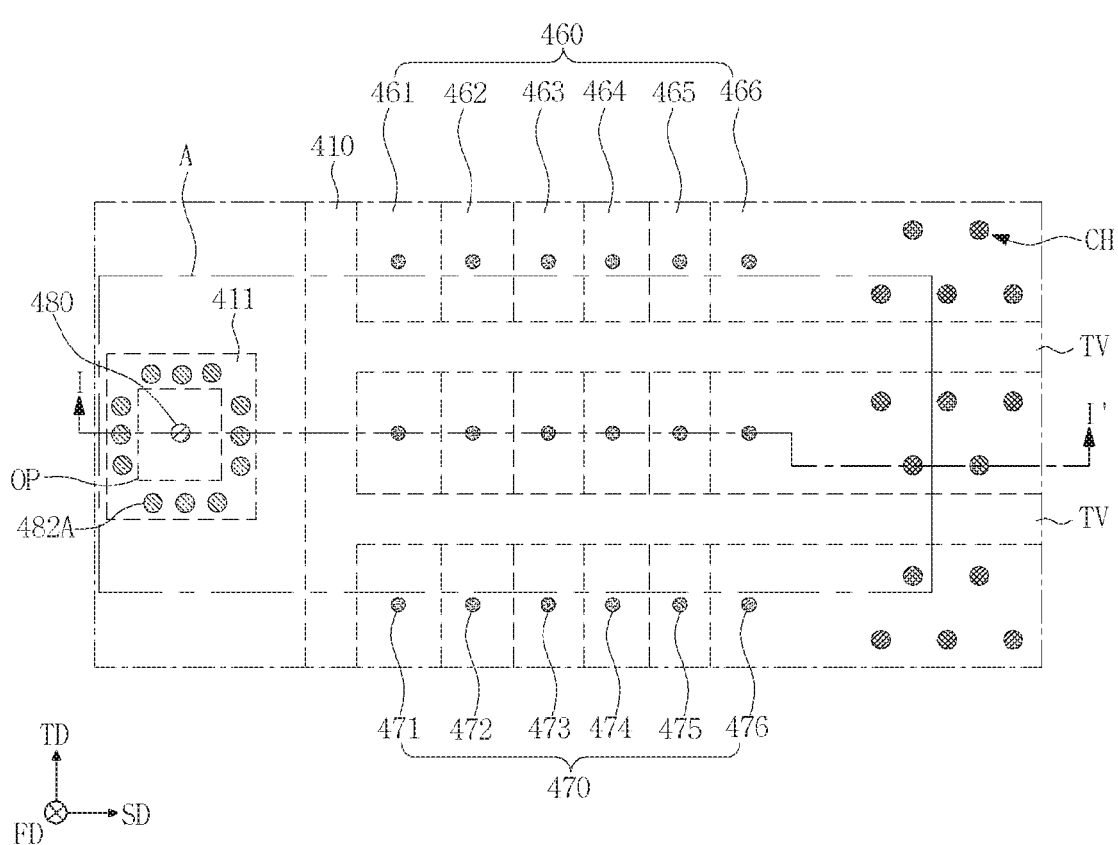
FIG. 3 is a top view illustrating a representation of an example of a semiconductor memory device in accordance with an embodiment of the present invention.

FIG. 3 is a top view illustrating a representation of an example of a semiconductor memory device in accordance with an embodiment of the present invention.

Referring to FIG. 3, the semiconductor memory device in accordance with the embodiment may include a plurality of channel structures CH, first contacts 471 to 476, collectively indicated with numeral 470, which are coupled to a plurality of gate electrode layers 461 to 466, collectively indicated by numeral 460, respectively, stacked to be adjacent to the channel structures CH, a second contact 480 which is coupled to a bottom wiring line 340 (see FIG. 4), and a plurality of dummy contacts 482A which are disposed adjacent to the second contact 480.

The channel structures CH, the first contacts 470, the second contact 480 and the dummy contacts 482A may extend in the first direction FD. The gate electrode layers 460 may be stacked on the second substrate 410 along the first direction FD to surround the channel structures CH. The gate electrode layers 460 and the channel structures CH may be divided into a plurality of regions by vertical slits TV. Each of the plurality of regions defined by the vertical slits TV may be provided as a memory block.

The channel structures CH may be disposed in such a way as to be separated from one another in the second direction SD and the third direction TD. The number and disposition of the channel structures CH may be changed variously. For example, the channel structures CH may be disposed in a zigzag style as shown in FIG. 3. The disposition of the channel structures CH of memory blocks which are adjacent to each other with the vertical slits TV interposed therebetween may be symmetrical as shown in FIG. 3, but it is to be noted that the embodiment is not necessarily limited thereto.

Figure 4:
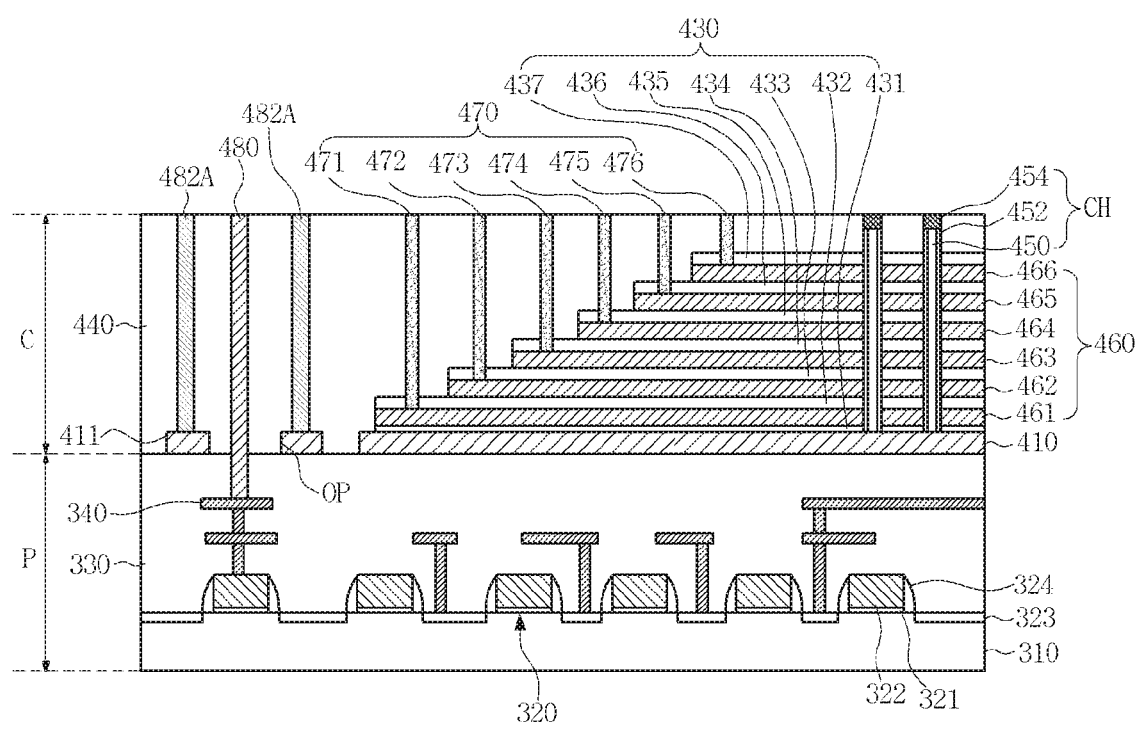
FIG. 4 is a cross-sectional view taken along the line I-I' of FIG. 3.
Figure 4:
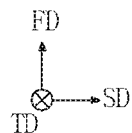

An etch stopper 411 may be disposed on one side at the same level as the second substrate 410 shown in FIG. 4. The etch stopper 411 may be disposed to be separated by a predetermined gap from the second substrate 410. The etch stopper 411 may have an opening OP. The etch stopper 411 may have a substantially rectangular frame shape when viewed from the top. The opening OP may be disposed in a center portion of the etch stopper 411. The opening OP overlaps with the second contact 480. The second contact 480 may pass through the opening OP of the etch stopper 411 to contact the bottom wiring line 340 shown in FIG. 4.

The dummy contacts 482A may be disposed adjacent to the second contact 480. The dummy contacts 482A may be provided around the second contact 480 in a plural number. The plurality of dummy contacts 482A may be arranged in a generally rectangular frame shape which surrounds the second contact 480. The dummy contacts 482A may overlap with the etch stopper 411 in the first direction FD. The dummy contacts 482A may be arranged along the edges of the opening OP of the etch stopper 411.

Each of the dummy contacts 482A may have the same shape as the second contact 480 when viewed from the top. For example, the second contact 480 and the dummy contacts 482A may have a circular shape as shown in FIG. 3 when viewed from the top. The planar area of each dummy contact 482A may be substantially the same as the planar area of the second contact 480. The dummy contacts 482A may be formed of the same material as the second contact 480. For example, the second contact 480 and the dummy contacts 482A may be made of or include at least one of a metal and a metal silicide.

Figure 5:
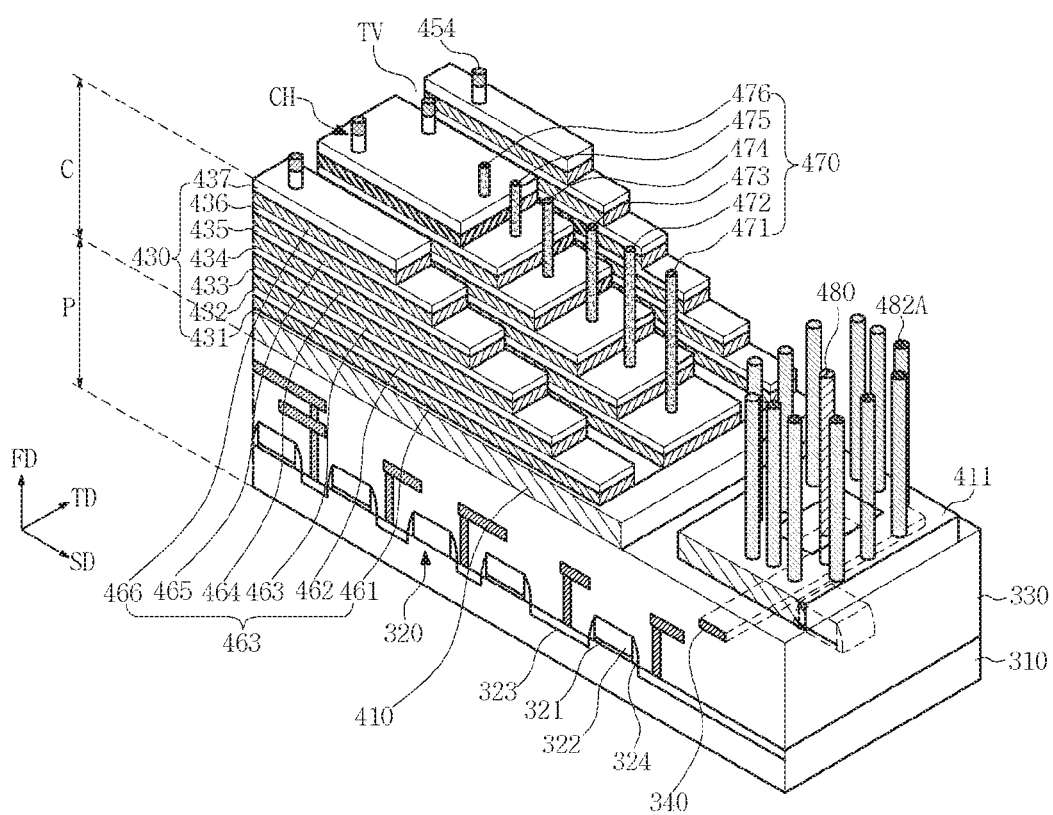
FIG. 5 is a perspective view illustrating the part A of FIG. 3.

Hereunder, the components of the semiconductor memory device in accordance with the embodiment will be described in detail with reference to FIGS. 4 and 5. FIG. 4 is a cross-sectional view taken along the line I-I' of FIG. 3, and FIG. 5 is a perspective view illustrating the part A of FIG. 3. In FIG. 5, in order to easily explain the structures and dispositions of the contacts 470, 480 and 482A, illustration of a second dielectric layer 440 is omitted.

Referring to FIGS. 4 and 5, the semiconductor memory device in accordance with the embodiment may have a PUC (peri under cell) structure. A cell region C including the plurality of gate electrode layers 461 to 466 (460) and the channel structures CH may be defined on the top of a peripheral circuit region P including a plurality of peripheral circuit elements 320.

The peripheral circuit region P may include the first substrate 310, and the cell region C may include the second substrate 410. The first substrate 310 may include at least one selected from the group including a monocrystalline silicon substrate, an SOI (silicon on insulator), silicon formed on a silicon germanium (SiGe) layer, monocrystalline silicon formed on a dielectric layer and polysilicon formed on a dielectric layer. The second substrate 410 may be formed of polycrystalline silicon. Since the second substrate 410 should be formed on a first dielectric layer 330 unlike the first substrate 310 which may use a monocrystalline silicon substrate, the second substrate 410 may be formed of polysilicon.

The peripheral circuit region P may include the first substrate 310, the peripheral circuit elements 320, the first dielectric layer 330 and the bottom wiring line 340. The peripheral circuit elements 320 may include planar transistors. In an embodiment, the peripheral circuit elements 320 are constructed by planar transistors, each of the peripheral circuit elements 320 may include a gate dielectric layer 321, a gate electrode 322, source/drain regions 323 and gate spacers 324. The peripheral circuit elements 320 may construct the peripheral circuit 200 of FIG. 1.

The first dielectric layer 330 may be formed on the first substrate 310 to cover the peripheral circuit elements 320. The first dielectric layer 330 may be or include a dielectric material, for example, a silicon oxide.

The bottom wiring line 340 may be disposed in the first dielectric layer 330, and may be electrically coupled to at least one of the peripheral circuit elements 320.

The cell region C may be disposed on the peripheral circuit region P. The second substrate 410 included in the cell region C may be disposed on the top surface of the first dielectric layer 330 of the peripheral circuit region P.

The channel structures CH may be disposed on the top surface of the second substrate 410. The channel structures CH may extend from the top surface of the second substrate 410 in the first direction FD. The gate electrode layers 461 to 466 (460) may be stacked on the top surface of the second substrate 410 to surround the channel structures CH.

The gate electrode layers 460 may correspond to the row lines RL described above with reference to FIG. 1. At least one layer from the lowermost among the gate electrode layers 460 may be used as a source select line. At least one layer from the uppermost among the gate electrode layers 460 may be used as a drain select line. The gate electrode layers 460 between the source select line and the drain select line may be used as word lines. Source select transistors may be formed where the source select line surrounds the channel structures CH, memory cells may be formed where the word lines surround the channel structures CH, and drain select transistors may be formed where the drain select line surrounds the channel structures CH. By the above structure, cell strings including source select transistors, memory cells and drain select transistors which are disposed along the channel structures CH may be constructed.

The gate electrode layers 460 may extend by different lengths along the second direction SD to form a step structure in a partial region on the second substrate 410. Interlayer dielectric layers 431 to 437, collectively indicated with numeral 430 may be disposed on and under the gate electrode layers 460. The gate electrode layers 460 and the Interlayer dielectric layers 430 may be alternatively stacked on the top surface of the second substrate 410 to surround the channel structures CH. The interlayer dielectric layers 430 may include silicon oxide layers. The interlayer dielectric layers 431 to 437 may also extend by different lengths along the second direction SD to in conformity to the step structure of the gate electrode layers 460. Each of the channel structures CH may include a channel layer 450 and a gate dielectric layer 452 which is disposed between the channel layer 450 and the gate electrode layers 460 and the interlayer dielectric layers 430. The channel layer 450 may be made of or include polysilicon or monocrystalline silicon, and may include a P-type impurity. The channel layer 450 may include boron (B) in some regions. The channel layer 450 may have the shape of a pillar or a solid cylinder which is completely filled up to its center. In a modified embodiment, (not shown), the channel layer 450 may have the shape of a tube in which a center region is open. In this case, a buried dielectric layer may be formed in the open center region of the channel layer 450.

The gate dielectric layer 452 may have the shape of a straw or a cylindrical shell which surrounds the outer wall of the channel layer 450. While not shown, the gate dielectric layer 452 may include a tunnel dielectric layer, a charge storage layer and a blocking layer which are sequentially stacked from the outer wall of the channel layer 450. The tunnel dielectric layer may be made of or include a silicon oxide, a hafnium oxide, an aluminum oxide, a zirconium oxide or a tantalum oxide. The charge storage layer may be made of or include a silicon nitride, a boron nitride, a silicon boron nitride or polysilicon doped with an impurity. The blocking layer may be made of or include a single layer or a stack layer of a silicon oxide, a silicon nitride, a hafnium oxide, an aluminum oxide, a zirconium oxide and a tantalum oxide. In some embodiments, the gate dielectric layer 452 may have an ONO (oxide-nitride-oxide) stack structure in which an oxide layer, a nitride layer and an oxide layer are sequentially stacked.

Each of the channel structures CH may further include a drain region 454 which is disposed on the tops of the channel layer 450 and the gate dielectric layer 452. The drain region 454 may be made of or include doped polysilicon.

The second dielectric layer 440 which covers the side surfaces and top surfaces of the second substrate 410, the gate electrode layers 460 and the interlayer dielectric layers 430 and covers the side surfaces of the channel structures CH may be formed on the first dielectric layer 330. The second dielectric layer 440 may be formed of the same material as the first dielectric layer 330.

The plurality of first contacts 471 to 476 (470) extend through the second dielectric layer 440 in the first direction FD and are coupled to the gate electrode layers 461 to 466 (460), respectively. The plurality of the first contacts 471 to 476 (470) may be formed on the step structure of the gate electrode layers 460.

The second contact 480 is formed on one side of the gate electrode layers 460 and the second substrate 410, extends through the second dielectric layer 440 and the first dielectric layer 330 in the first direction FD, and is coupled to the bottom wiring line 340. The second contact 480 is electrically coupled to at least one of the plurality of peripheral circuit elements 320 through the bottom wiring line 340.

The second contact 480 electrically couples a top wiring line (not shown) formed on the second dielectric layer 440 with the bottom wiring line 340. The second contact 480 is disposed to stand alone because the required number thereof is small and the frequency of use thereof is low.

In order to form the second contact 480, a hard mask pattern which opens a portion where the second contact 480 is to be formed may be formed on the second dielectric layer 440, a hole which exposes the bottom wiring line 340 may be formed by etching the second dielectric layer 440 opened by the hard mask pattern and the first dielectric layer 330, and a conductive material may be filled in the hole.

Due to increase in the degree of integration, the stack number of the gate electrode layers 460 is increased, and the thickness of the second dielectric layer 440 increases. Carbon from hydrofluorocarbon which is an etching compound produced during a hole etching process accumulates in the hole during etching and is polymerized to form a polymer. The accumulation of the polymer occurs adjacent to the sidewall of the hard mask pattern as the upper sidewall of the hole. As the thickness of the second dielectric layer 440 increases and thus an amount of the second dielectric layer 440 to be etched in the hole etching process increases, an amount of the polymer produced during the hole etching process increases as well.

The polymer is produced less in a portion where a hole pattern density is high, but is produced much in an embodiment a hole pattern density is low and a distance from an adjacent hole is large. Since the second contact 480 is disposed in such a way as to stand alone, a thick polymer layer may accumulate on the upper sidewall of the hole during the etching process for forming the hole, and the entrance of the hole may be clogged by the polymer layer, whereby the flow of an etchant into the hole may be blocked. In this case, the bottom portion of the hole may not be opened. As a consequence, since the second contact 480 is not electrically coupled to the bottom wiring line 340, the normal operation of the semiconductor memory device may be impossible, and thus, the reliability of the semiconductor memory device may degrade.

In the present embodiment, the dummy contacts 482A are additionally disposed around the second contact 480. The dummy contacts 482A may pass through the second dielectric layer 440 in the first direction FD.

The dummy contacts 482A are formed together with the second contact 480 when forming the second contact 480. For example, by additionally forming holes for dummy contacts at positions adjacent to a hole for a second contact in the hole etching process for forming the second contact 480 and filling a conductive material in the holes for dummy contacts in a process of filling a conductive material in the hole for a second contact, the second contact 480 and the dummy contacts 482A may be formed together.

Because the pattern density of a region for forming the hole for a second contact is increased due to the presence of the holes for dummy contacts, excessive production of a polymer due to a low pattern density when etching the hole is suppressed, whereby it is possible to prevent the hole for the second contact from being clogged by the polymer. Therefore, since it is possible to cause an etchant to smoothly flow into the hole for the second contact, blocking of the opening of the hole for a second contact may be prevented. Hence, it is possible to prevent the occurrence of a failure in which the second contact 480 is not electrically coupled to the bottom wiring line 340 due to blocking of the opening of the hole for the second contact.

The etch stopper 411 may be disposed under the dummy contacts 482A. The etch stopper 411 may be coupled to the bottom ends of the dummy contacts 482A. The etch stopper 411 may be disposed on the top surface of the first dielectric layer 330. The etch stopper 411 may be disposed on the top surface of the first dielectric layer 330 to be planar with the second substrate 410.

The etch stopper 411 may be made or include a material which has a predetermined etching selectivity different from the second dielectric layer 440. In an embodiment, in an embodiment the second dielectric layer 440 is a silicon oxide layer, the etch stopper 411 may be constructed by at least one of a silicon nitride layer and a polycrystalline silicon layer. The etch stopper 411 may be formed at the same processing step as the second substrate 410. In this case, the etch stopper 411 may be formed of the same material as the second substrate 410, for example, a polycrystalline silicon layer.

In the process for forming the holes for the dummy contacts, as etching is stopped by the etch stopper 411, the holes for the dummy contacts do not extend to the bottom wiring line 340 and the peripheral circuit elements 320 of the peripheral circuit region P. Hence, the etch stopper 411 prevents a short circuit from occurring by preventing the dummy contacts 482A to be coupled with the bottom wiring line 340 and the peripheral circuit elements 320.

The etch stopper 411 may have the opening OP through which the second contact 480 passes. The opening OP may be disposed to overlap with a portion of the bottom wiring line 340 in the first direction FD. The second contact 480 may be coupled to the bottom wiring line 340 by passing through the opening OP of the etch stopper 411.

The dummy contacts 482A may be coupled to the etch stopper 411 through the second dielectric layer 440 in the first direction FD. Each of the dummy contacts 482A may have substantially the same structure as the second contact 480 when viewed from the top. For example, the second contact 480 and the dummy contacts 482A may have a circular structure when viewed from the top. Each of the dummy contacts 482A may have substantially the same size as the second contact 480 when viewed from the top.

In an embodiment, the plurality of dummy contacts 482A may be provided around the second contact 480. The plurality of dummy contacts 482A may be arranged in a shape which surrounds the second contact 480 when viewed on the top. In an embodiment, the plurality of dummy contacts 482A may be arranged along the edges of the opening OP of the etch stopper 411.

According to the present embodiment, by additionally forming the holes for dummy contacts at the positions adjacent to the hole for the second contact during the etching process for forming the hole for the second contact, it is possible to suppress a polymer from being produced on the sidewall of the hole for the second contact, during the etching process for forming the hole for the second contact. Therefore, the present invention prevents the hole for the second contact from being clogged by the polymer and allows the n etchant to flow smoothly into the hole for the second contact. Hence failure to obtain a fully opened hole for the second contact is prevented. Thus, since it is possible to prevent a coupling failure between the second contact 480 and the bottom wiring line 340 due to blocking of the opening of the hole for the second contact, the reliability of the semiconductor memory device may be improved substantially In embodiments to be described below with reference to FIGS. 6 to 8, the same technical terms and the same reference numerals will be used to refer to substantially the same components as the components of the embodiment described above with reference to FIGS. 3 to 5, and therefore repeated detailed descriptions for the same components will be omitted.

Figure 6:
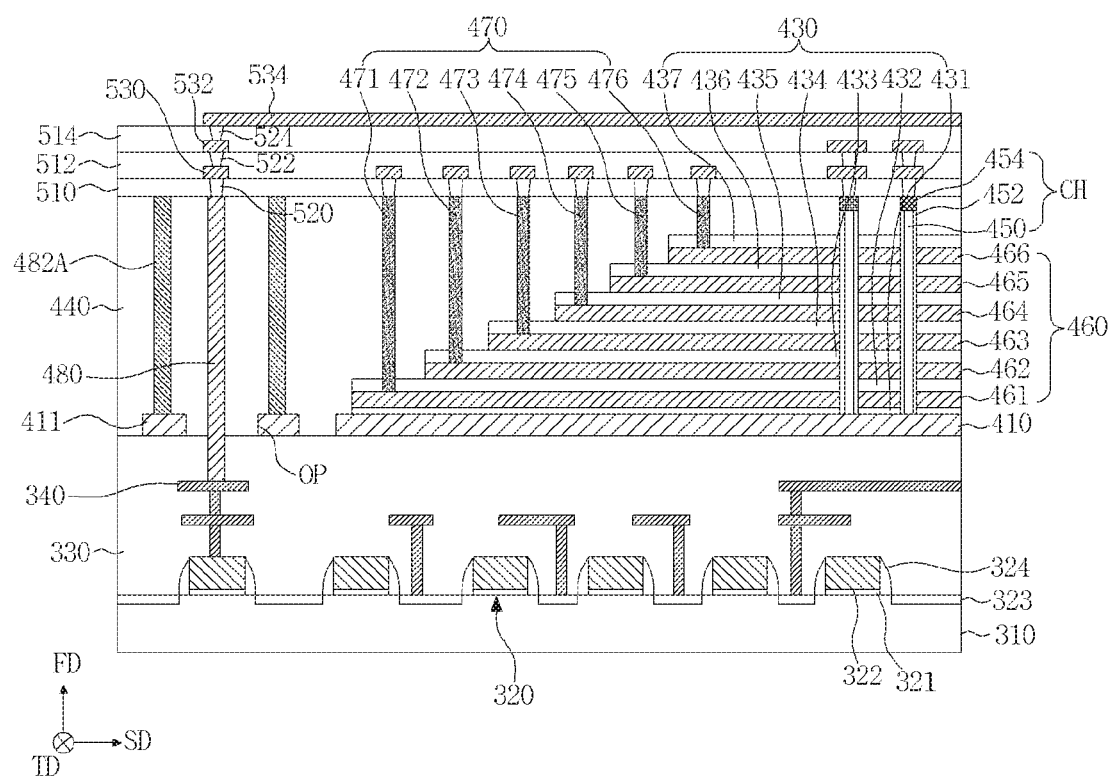
FIG. 6 is a cross-sectional view illustrating a representation of an example of a semiconductor memory device in accordance with an embodiment of the present invention.

FIG. 6 is a cross-sectional view illustrating a representation of an example of a semiconductor memory device in accordance with an embodiment of the present invention.

Referring to FIG. 6, a third dielectric layer 510 which covers the top surfaces of the first contacts 470, the second contact 480, the dummy contacts 482A and the channel structures CH may be formed on the second dielectric layer 440. The third dielectric layer 510 may be made of or include a dielectric material such as, for example, a silicon oxide.

A third contact 520 which is coupled to the second contact 480 may be formed through the third dielectric layer 510. No contacts are formed on the dummy contacts 482A. A first top wiring line 530 which is coupled to the third contact 520 may be formed on the third dielectric layer 510. A fourth dielectric layer 512 which covers the side surfaces and top surface of the first top wiring line 530 may be formed on the third dielectric layer 510. The fourth dielectric layer 512 may be made of or include a dielectric material such as, for example, a silicon oxide.

A fourth contact 522 which is coupled to the first top wiring line 530 may be formed through the fourth dielectric layer 512. A second top wiring line 532 which is coupled to the fourth contact 522 may be formed on the fourth dielectric layer 512. A fifth dielectric layer 514 which covers the side surfaces and top surface of the second top wiring line 532 may be formed on the fourth dielectric layer 512. The fifth dielectric layer 514 may be made of or include a dielectric material such as, for example, a silicon oxide. A fifth contact 524 which is coupled to the second top wiring line 532 may be formed through the fifth dielectric layer 514. A third top wiring line 534 which is coupled to the fifth contact 524 may be formed on the fifth dielectric layer 514. The third top wiring line 534 may be electrically coupled to peripheral circuit elements 320 through the fifth contact 524, the second top wiring line 532, the fourth contact 522, the first top wiring line 530, the third contact 520, the second contact 480 and the bottom wiring line 340.

Figure 7:
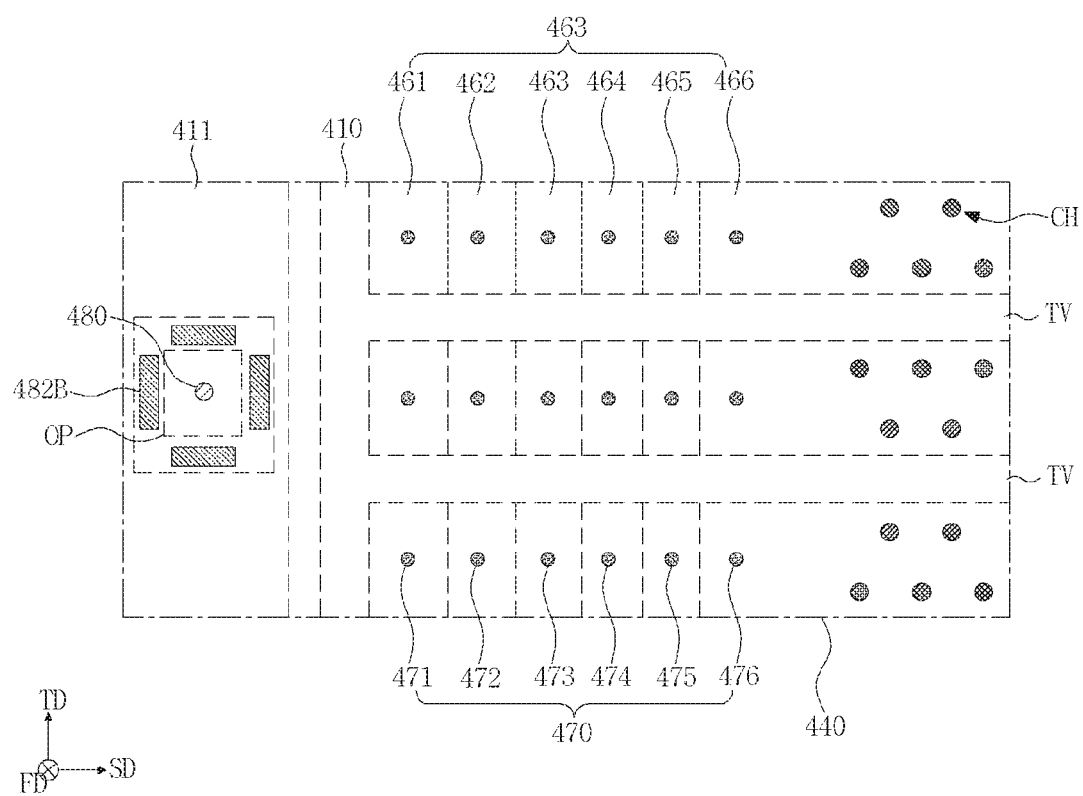
FIGS. 7 and 8 are top views illustrating representations of examples of semiconductor memory devices in accordance with embodiments of the present invention.
Figure 8:
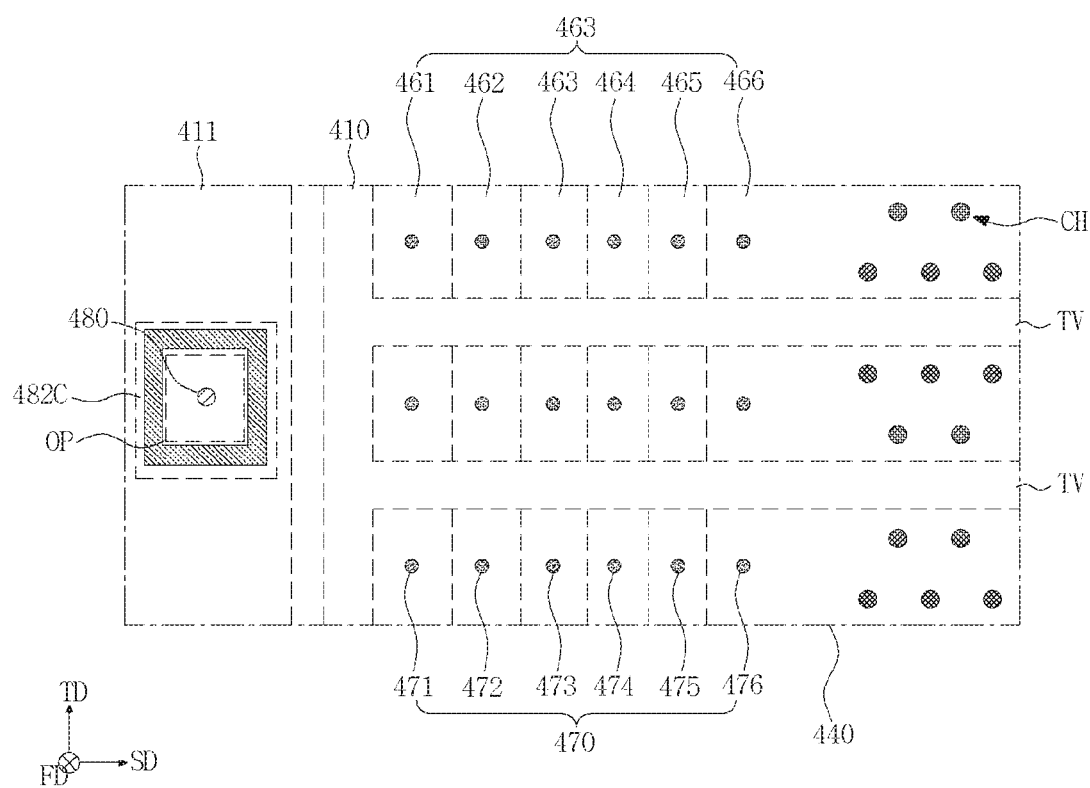

FIGS. 7 and 8 are top views illustrating representations of examples of semiconductor memory devices in accordance with embodiments of the present invention.

Referring to FIG. 7, a plurality of dummy contacts 482B are disposed adjacent to a second contact 480. Each of the dummy contacts 482B may have a different shape from the second contact 480 when viewed from the top. For example, the second contact 480 may have a circular shape when viewed from the top, and each of the dummy contacts 482B may have a bar shape. The plurality of dummy contacts 482B may be arranged to form in a rectangular frame shape which surrounds the second contact 480 when viewed on the top. In the illustrated embodiment of FIG. 7, four bar shape dummy contacts are provided, each one forming one side of the rectangular frame with the dummy contacts not contacting one another.

Referring to FIG. 8, a dummy contact 482C may be disposed around a second contact 480. The dummy contact 482C may have a shape which surrounds the second contact 480, when viewed from the top. Hence, in the embodiment of FIG. 8, one dummy contact in the form of a continuous rectangular frame 482C surrounds the second contact.

In other embodiments, not shown the dummy contact may have a continuous frame shape in circular, oval or polygonal etc. In other embodiments, not shown the dummy contact may be arranged in a non-continuous frame shape when viewed from the top.

FIGS. 9A to 17B are representations of examples of views to assist in the explanation of a method for manufacturing a semiconductor memory device in accordance with an embodiment of the present invention. FIGS. 9B to 17B are cross-sectional views taken along the lines II-II' of FIGS. 9A to 17A.

Figure 9A:
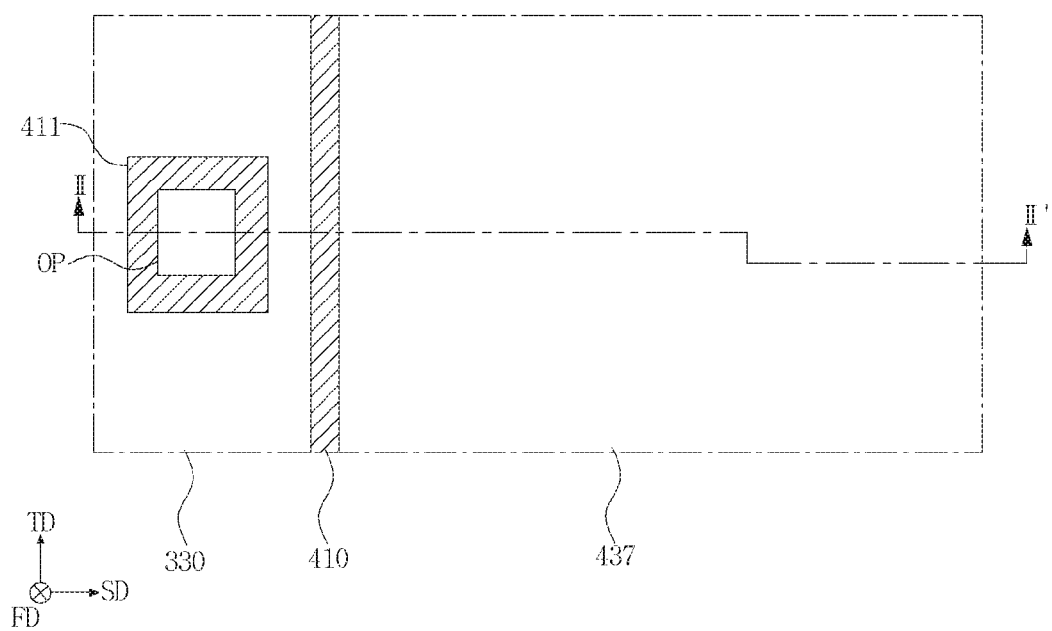
FIGS. 9A to 17B are representations of examples of views to assist in the explanation of a method for manufacturing a semiconductor memory device in accordance with an embodiment of the present invention.
Figure 9B:
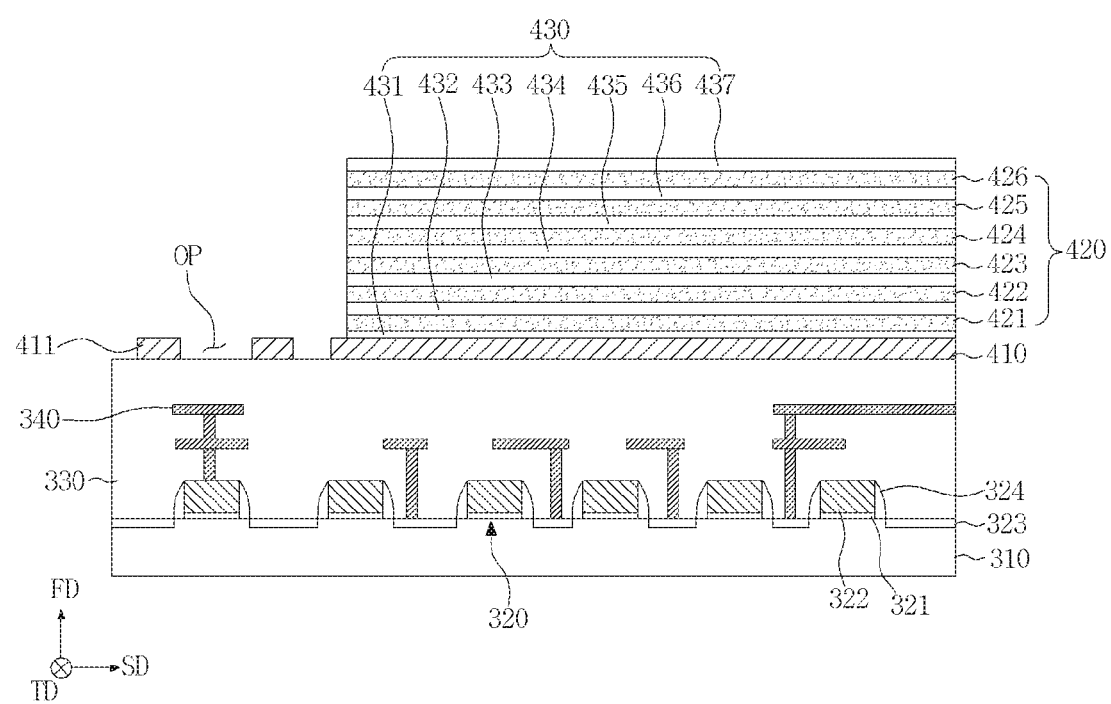

Referring to FIGS. 9A and 9B, peripheral circuit elements 320 and a first dielectric layer 330 may be formed on a first substrate 310. The first substrate 310 may be a monocrystalline silicon substrate. The peripheral circuit elements 320 may be or include planar transistors. In an embodiment, the peripheral circuit elements 320 are planar transistors, each including a gate dielectric layer 321, a gate electrode 322, source/drain regions 323 and gate spacers 324.

The peripheral circuit elements 320 may then be covered by the first dielectric layer 330. The first dielectric layer 330 may be made of or include a dielectric material, for example, a silicon oxide.

A bottom wiring line 340 may be defined in the first dielectric layer 330. The bottom wiring line 340 may be electrically coupled to the peripheral circuit elements 320. The bottom wiring line may be formed in a single or multiple layers.

A second substrate 410 may be formed on the top surface of the first dielectric layer 330. The second substrate 410 may be formed of polycrystalline silicon. The second substrate 410 may be formed by a method of forming polycrystalline silicon at a predetermined region on the first dielectric layer 330 and then growing polycrystalline silicon by using the polycrystalline silicon as a seed layer.

An etch stopper 411 may be formed on the top surface of the first dielectric layer 330. The etch stopper 411 may be disposed on the top surface of the first dielectric layer 330 to be planar with the second substrate 410. The etch stopper 411 may be made of or include a material which has a predetermined etching selectivity different from a second dielectric layer 440 which is formed in a process to be described later with reference to FIGS. 11A and 11B. In an embodiment, the second dielectric layer 440 is a silicon oxide layer, and the etch stopper 411 may be made of or include at least one of a silicon nitride layer and a polycrystalline silicon layer.

In an embodiment, the etch stopper 411 may be formed at the same processing step as the second substrate 410. In this case, the etch stopper 411 may be formed of the same material as the second substrate 410. The etch stopper 411 may have an opening OP that overlaps with a portion of the bottom wiring line 340 in the first direction FD.

A plurality of sacrificial layers 421 to 426, collectively indicated by numeral 420, and a plurality of interlayer dielectric layers 431 to 437, collectively indicated by numeral 430, may be alternately stacked on the second substrate 410. The sacrificial layers 420 may be formed of a material which has a high etching selectivity different from the interlayer dielectric layers 430 and thus are able to be selectively etched. For example, the interlayer dielectric layers 430 may be silicon oxide layers, and the sacrificial layers 420 may be silicon nitride layers.

Figure 10A:
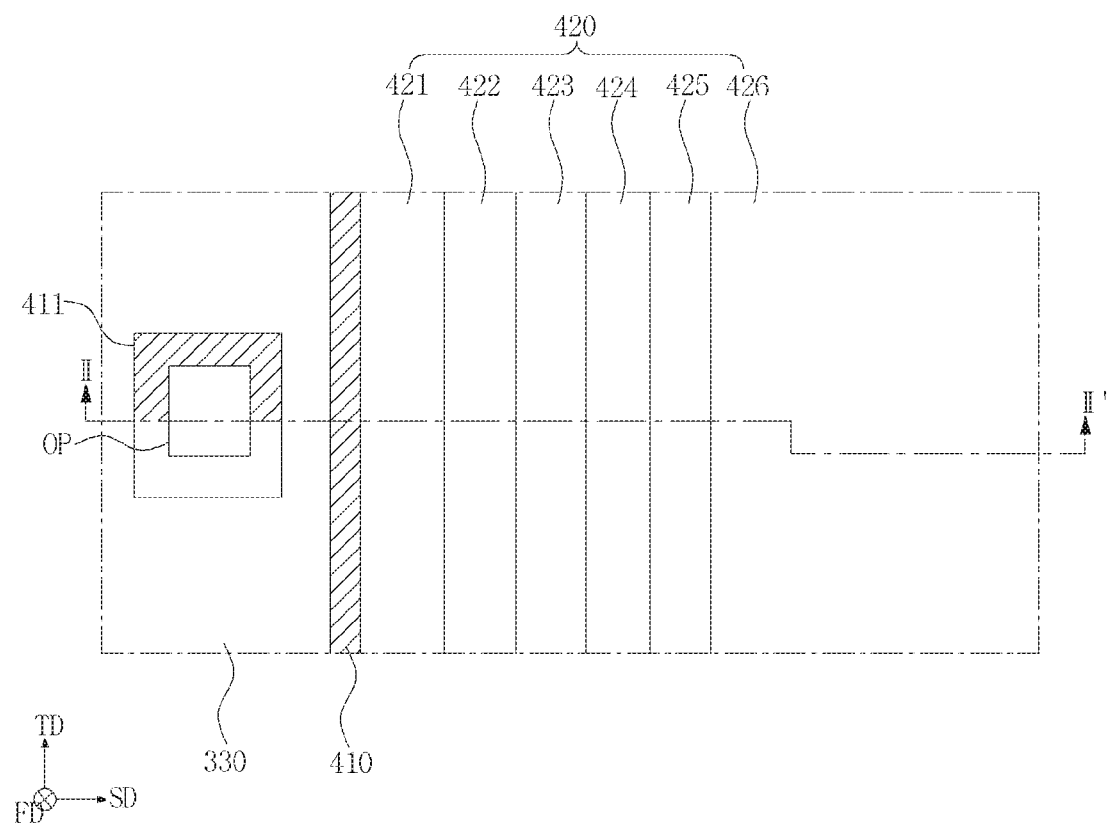
Figure 10B:
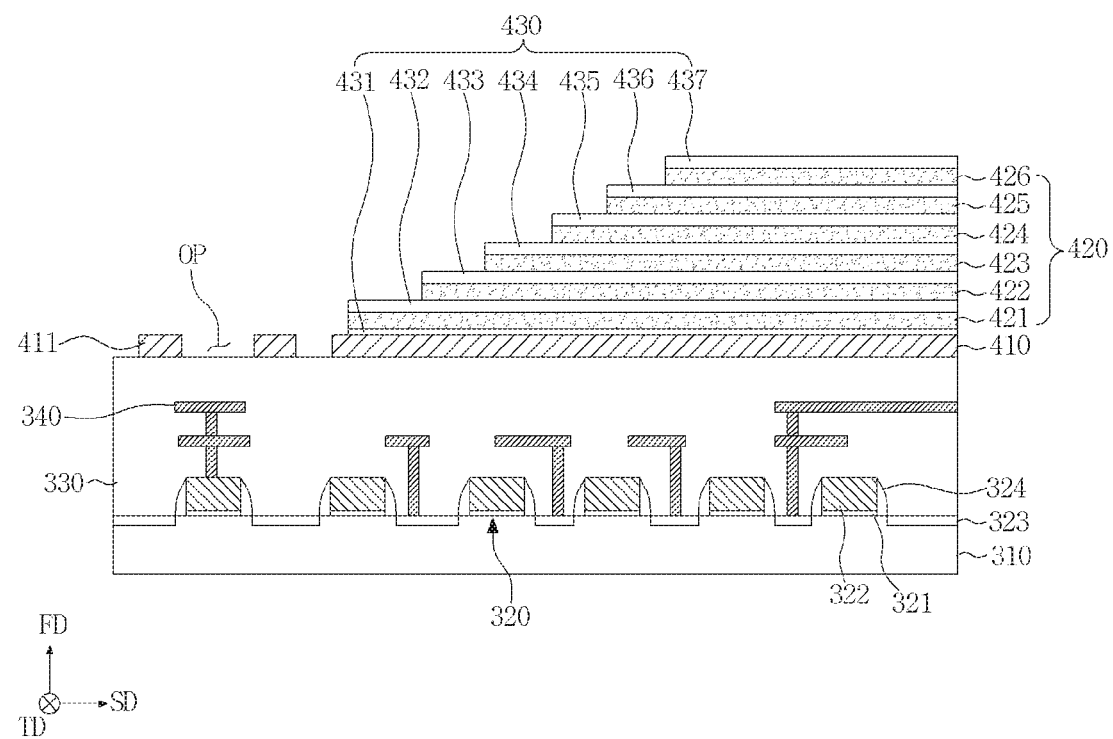

Referring to FIGS. 10A and 10B, by etching the sacrificial layers 420 and the interlayer dielectric layers 430, a step structure having step portions may be formed. In order to form the step portions, a mask layer (not shown) may be formed on the uppermost interlayer dielectric layer 437, and the interlayer dielectric layers 430 and the sacrificial layers 420 which are exposed by the mask layer may be etched. By performing, a plurality of times, the process of etching the interlayer dielectric layers 430 and the sacrificial layers 420 exposed by the mask layer while trimming the mask layer, the interlayer dielectric layers 430 and the sacrificial layers 420 may be sequentially etched, by which the step structure having step portions may be formed.

Figure 11A:
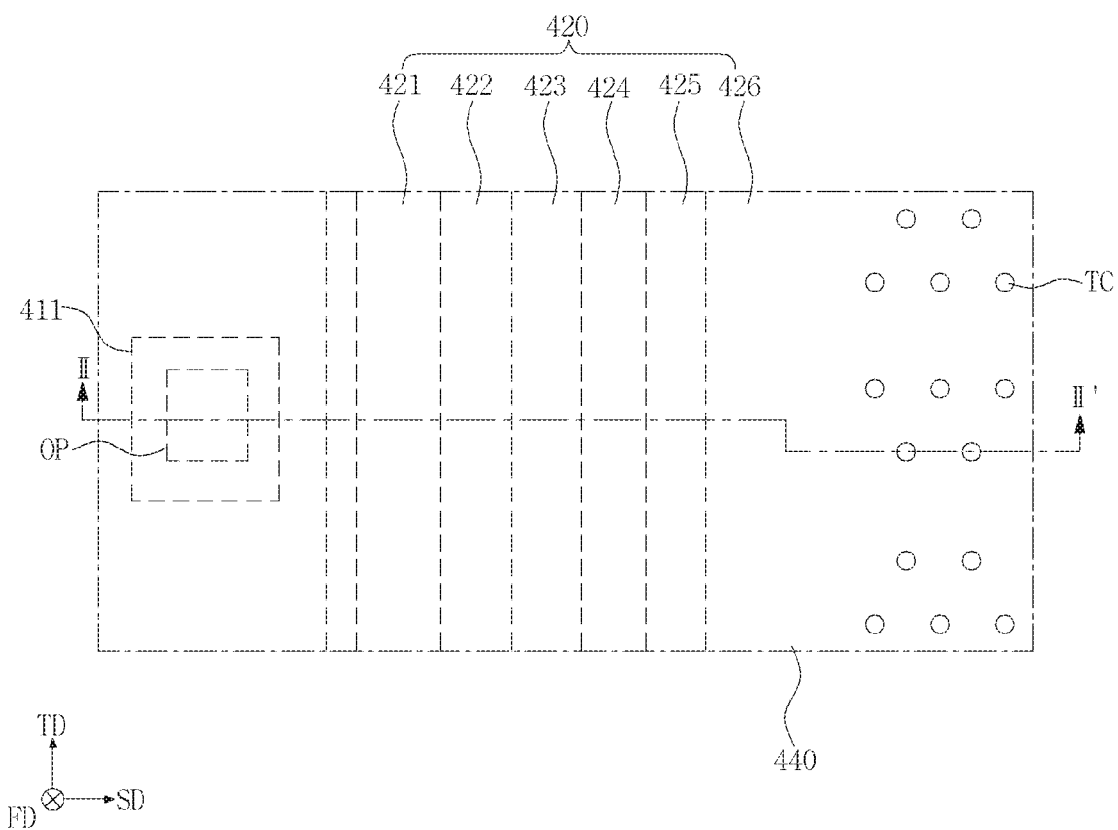
Figure 11B:
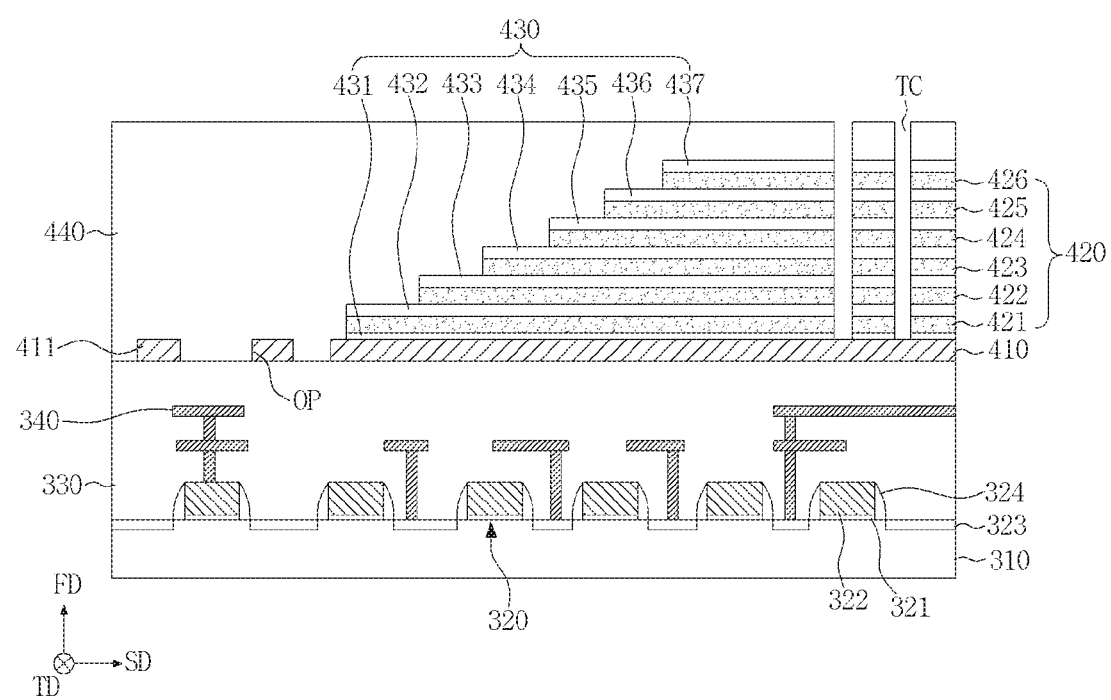

Referring to FIGS. 11A and 11B, the second dielectric layer 440 may be formed on the first dielectric layer 330 and may cover the exposed side surfaces and top surfaces of the second substrate 410, the etch stopper 411, the exposed side and top surfaces of the sacrificial layers 420 and of the interlayer dielectric layers 430. The second dielectric layer 440 may be made or include a silicon oxide layer. The opening OP of the etch stopper 411 may be filled with the second dielectric layer 440.

In order to form channel structures, a plurality of channel holes TC are formed which pass through the second dielectric layer 440, the interlayer dielectric layers 430 and the sacrificial layers 420 to expose the second substrate 410. The hole TC may be formed by forming a photoresist pattern (not shown) on the insulating film 440, etching the insulating film 440, the sacrificial layers 420 and the interlayer insulating films 430 using the photoresist pattern as a mask, and removing the photoresist pattern.

Figure 12A:
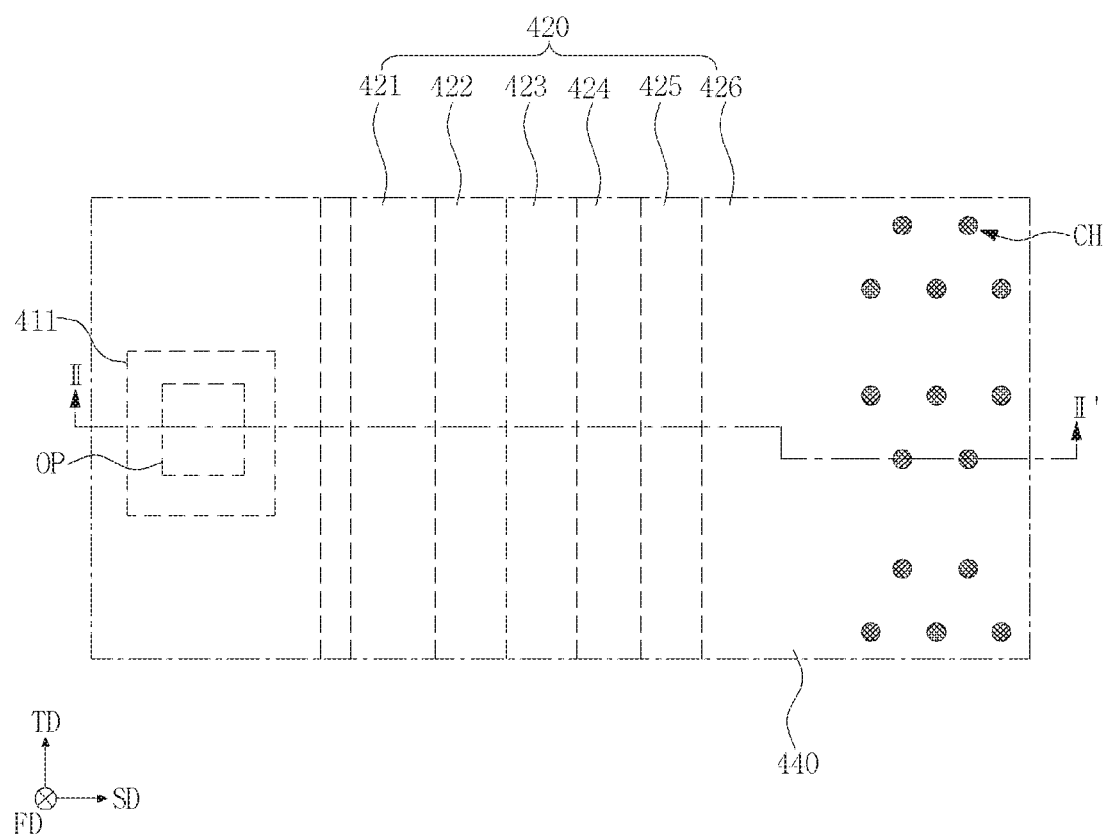
Figure 12B:
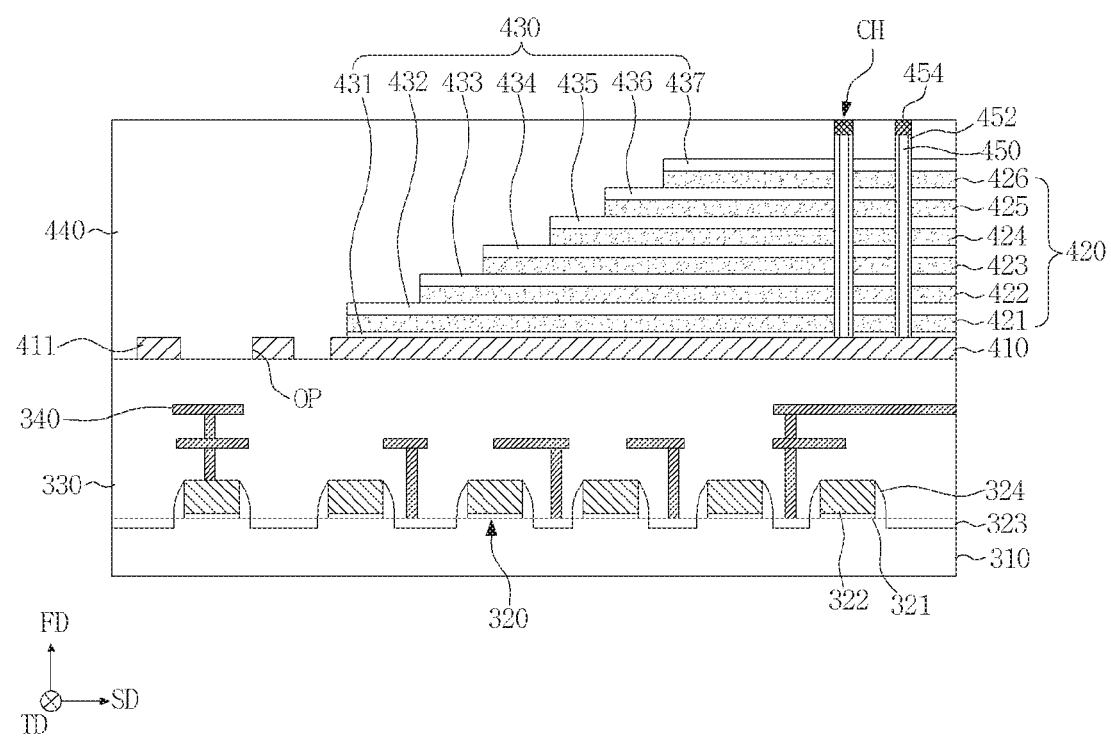

Referring to FIGS. 12A and 12B, by forming a channel layer 450, a gate dielectric layer 452 and a drain region 454 in each of the channel holes TC, channel structures CH may be formed.

The channel layer 450 may have the shape of a pillar or a solid cylinder which is completely filled up to its center. While not shown, the channel layer 450 may have the shape of a tube in which a center region is open. In this case, a buried dielectric layer may be formed in the open center region of the channel layer 450.

Before forming the channel layer 450, the gate dielectric layer 452 may be formed on a side wall of the channel holes TC through, for example, an atomic layer deposition (ALD) or chemical vapor deposition (CVD) process. While not shown, the gate dielectric layer 452 may include a blocking layer, a charge storage layer and a tunnel dielectric layer which are sequentially stacked from a region adjacent to the sacrificial layers 420 and the interlayer dielectric layers 430. The tunnel dielectric layer may be made of or include a silicon oxide, a hafnium oxide, an aluminum oxide, a zirconium oxide or a tantalum oxide. The charge storage layer may be made of or include a silicon nitride, a boron nitride, a silicon boron nitride or polysilicon doped with an impurity. The blocking layer may be made of or include a single layer or a stack layer of a silicon oxide, a silicon nitride, a hafnium oxide, an aluminum oxide, a zirconium oxide and a tantalum oxide. The channel layer 450 may be formed inward of the tunnel dielectric layer. In some embodiments, the gate dielectric layer 452 may have an ONO (oxide-nitride-oxide) stack structure in which an oxide layer, a nitride layer and an oxide layer are sequentially stacked.

The drain region 454 may be formed on the tops of the channel layer 450 and the gate dielectric layer 452. The drain region 454 may be made of or include a conductive material such as polysilicon.

Figure 13A:
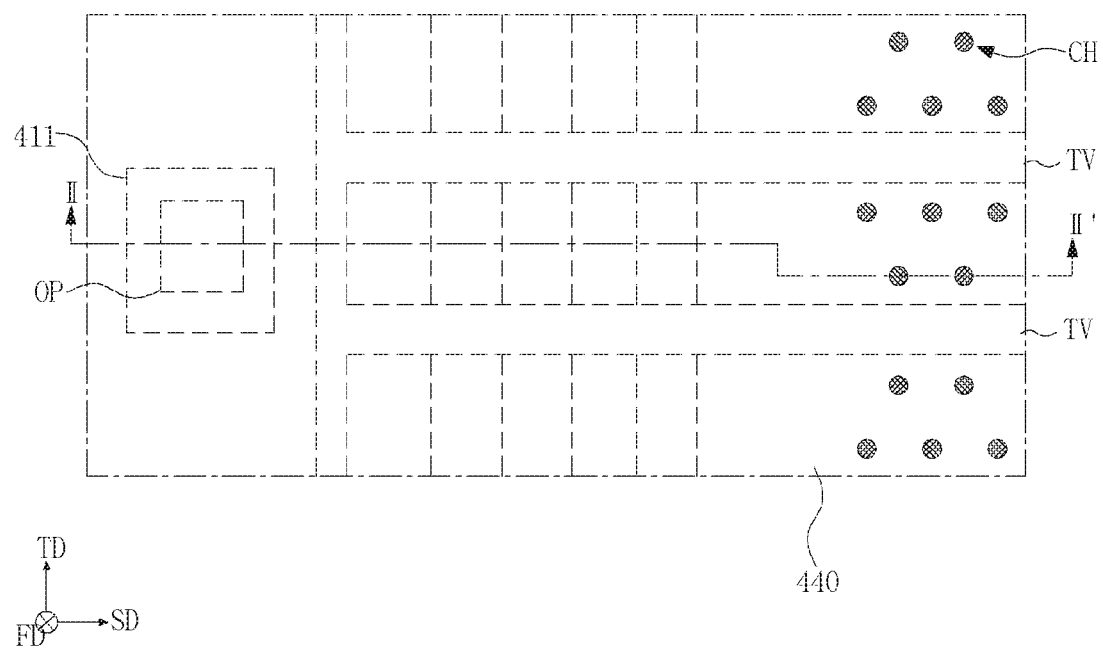
Figure 13B:
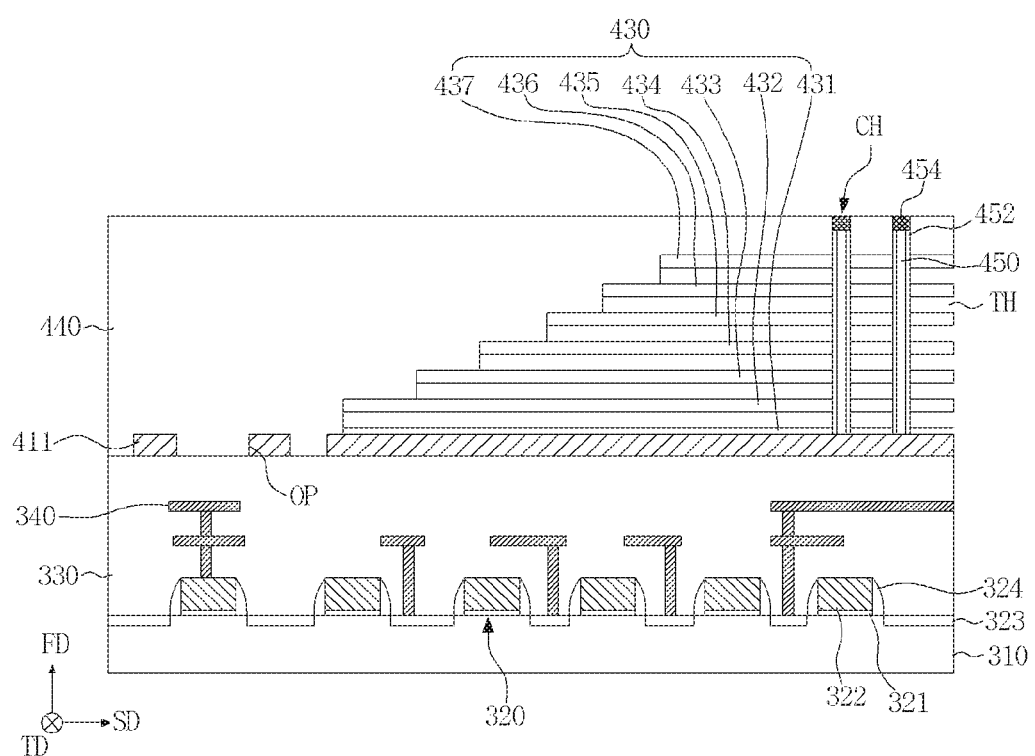

Referring to FIG. 13A, vertical slits TV which extend in the second direction SD are formed to pass through the sacrificial layers 420 and the interlayer dielectric layers 430 to expose the second substrate 410. The vertical slits TV may be spaced apart along the third direction TD. Referring to FIGS. 13A and 13B, the sacrificial layers 420 may then be selectively removed by an etchant which is introduced through the vertical slits TV. By removing the sacrificial layers 420, a plurality of horizontal openings TH may be defined between the interlayer dielectric layers 430. By the horizontal openings TH, portions of the side surfaces of the channel structures CH may be exposed. After being removed the sacrificial layers 420, the interlayer dielectric layers 430 may be supported by the channel structures CH.

Figure 14A:
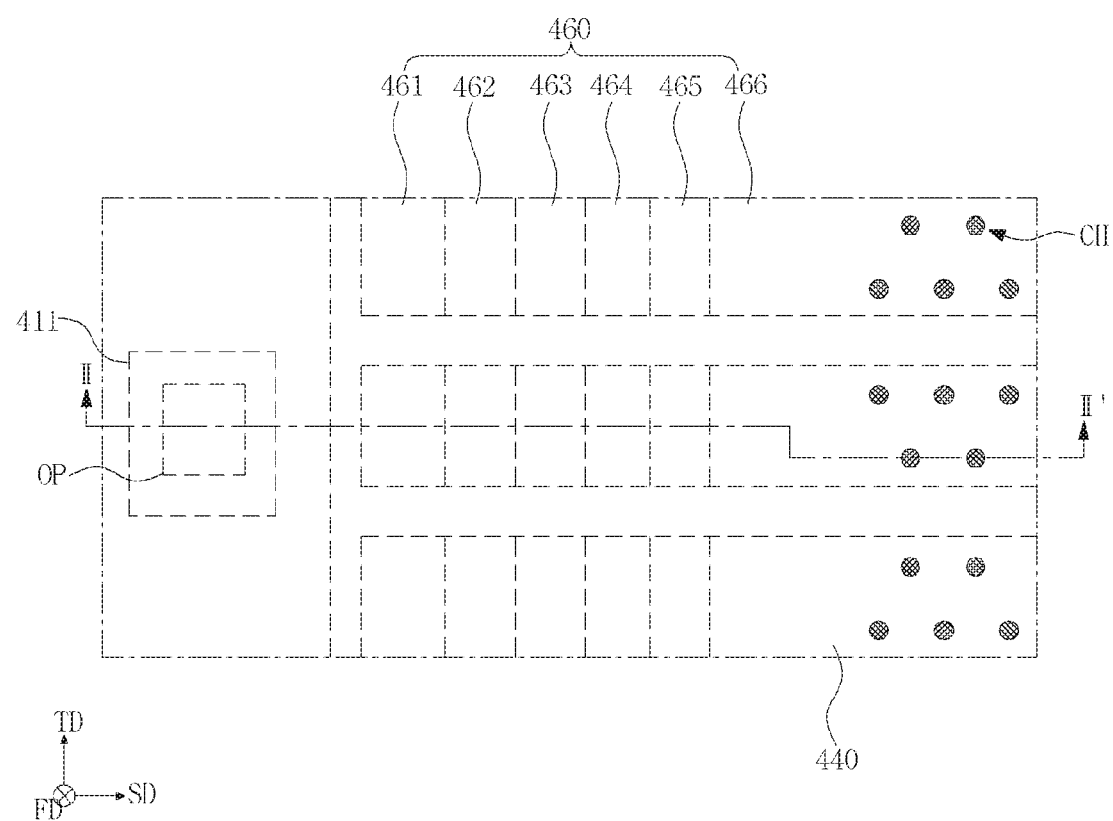
Figure 14B:
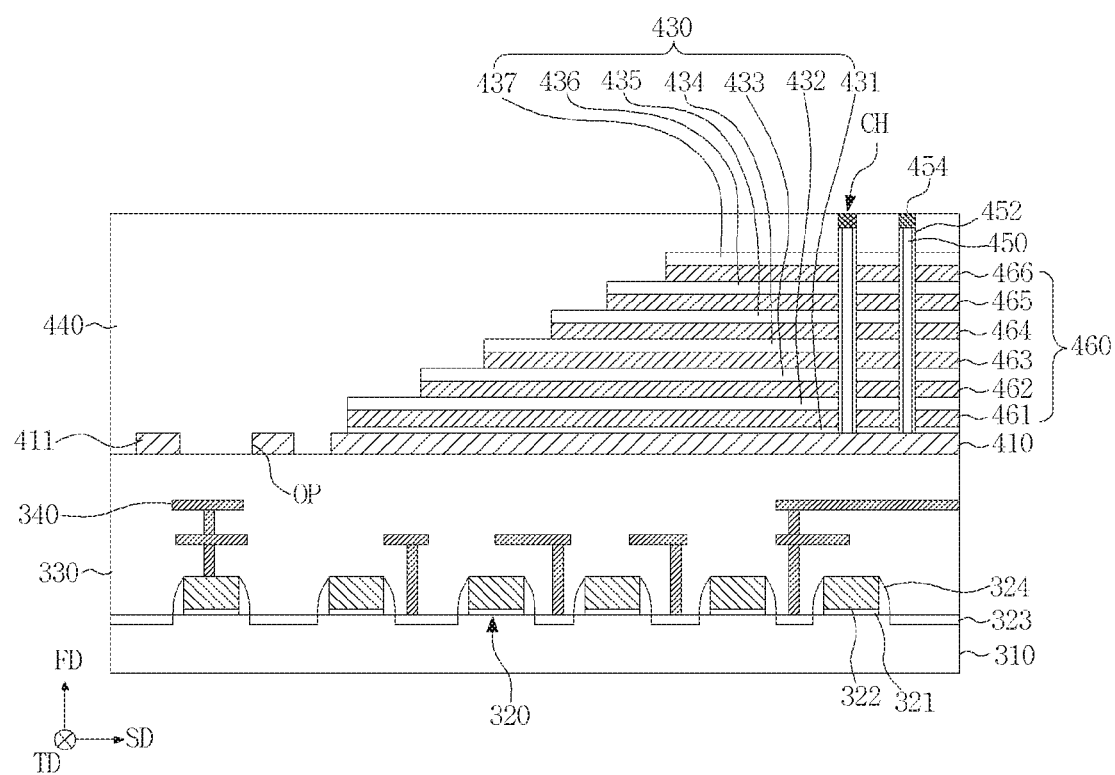

Referring to FIGS. 14A and 14B, a plurality of gate electrode layers 461 to 466, collectively indicated by numeral 460, may be formed in the plurality of horizontal openings TH (see FIG. 13B) which are defined as the sacrificial layers 420 are removed. The gate electrode layers 460 may be made of or include a metal, polycrystalline silicon or a metal silicide material.

Figure 15A:
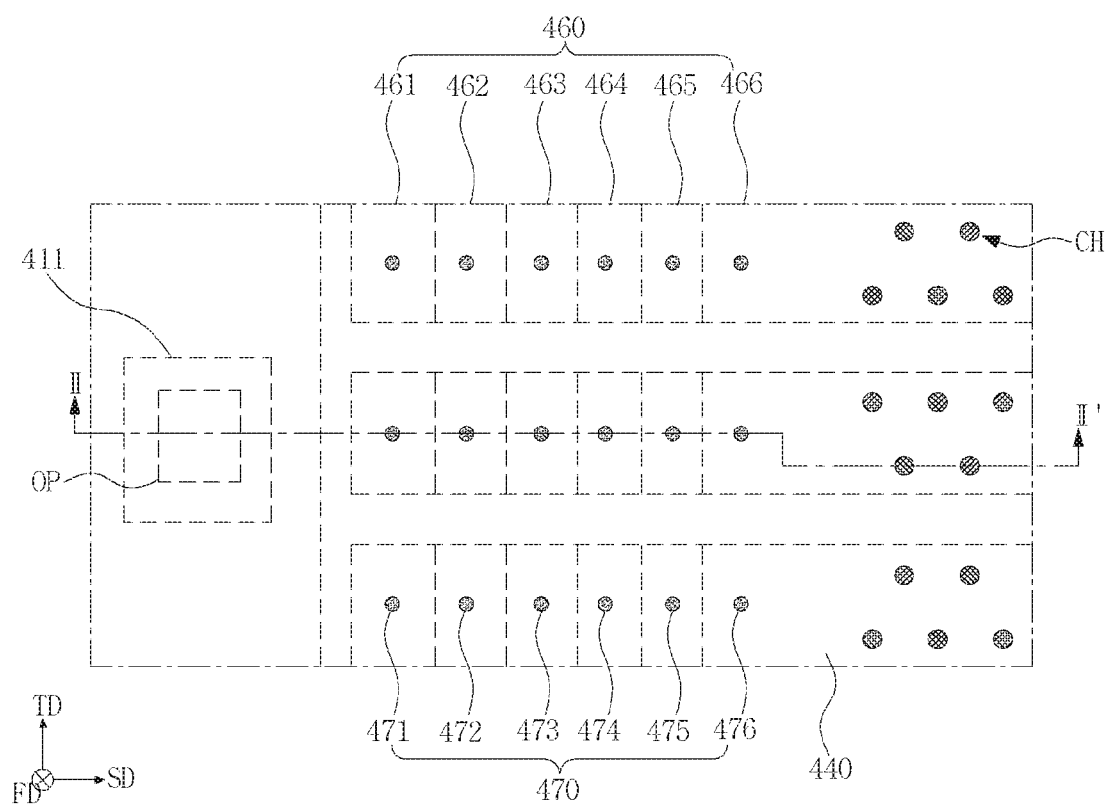
Figure 15B:
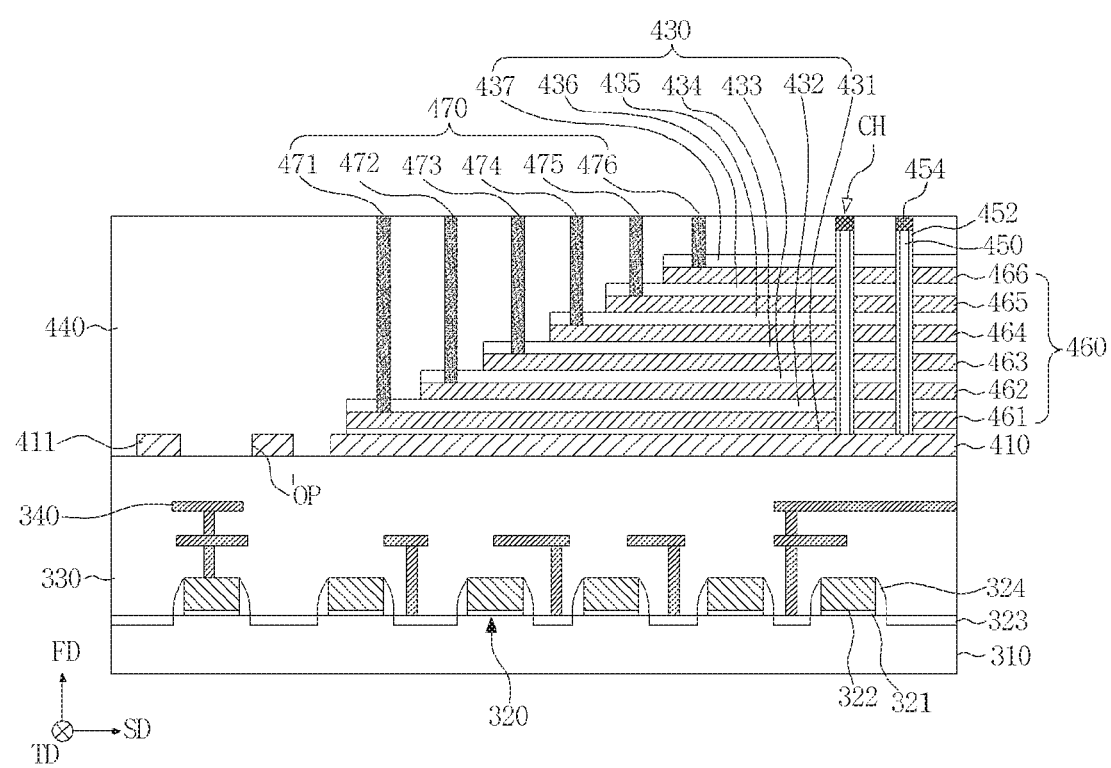

Referring to FIGS. 15A and 15B, first contacts 471 to 476, collectively indicated with numeral 470, are formed. The contacts 471 to 476 may be formed by forming holes which expose the gate electrode layers 460, respectively, through the second dielectric layer 440 and the interlayer dielectric layers 430, in the region defined with the step structure and by filling a conductive material in the holes.

Figure 16A:
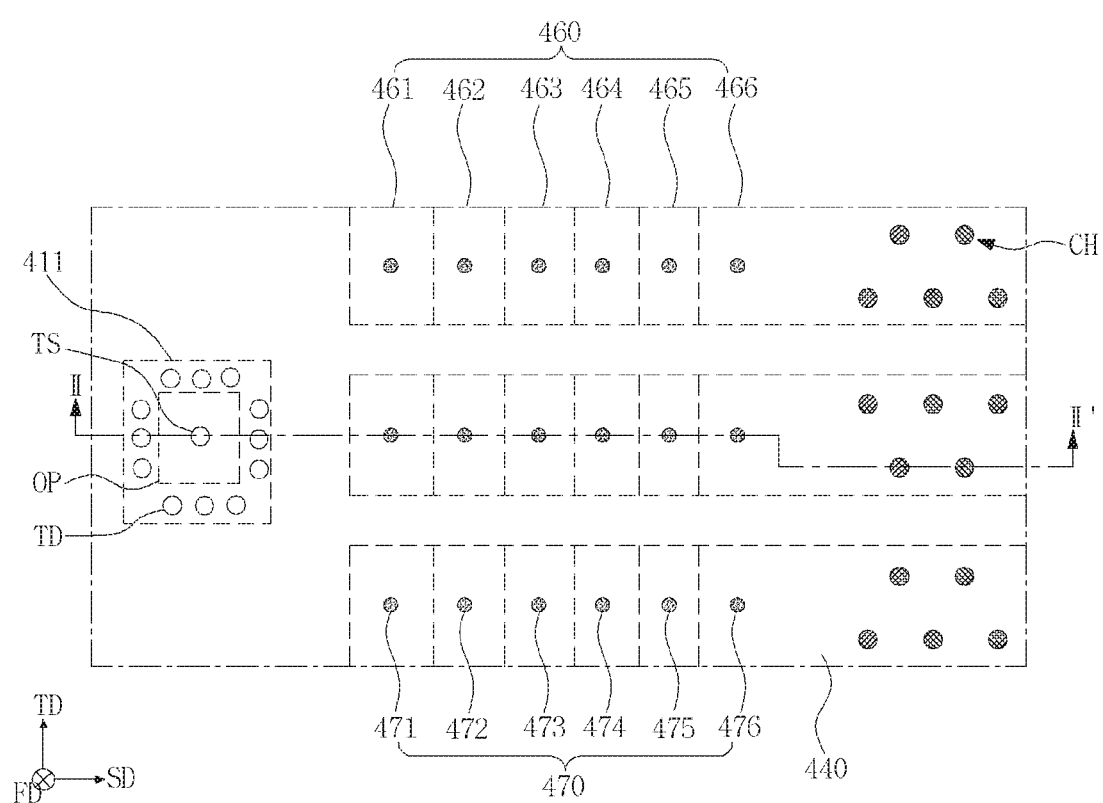
Figure 16B:
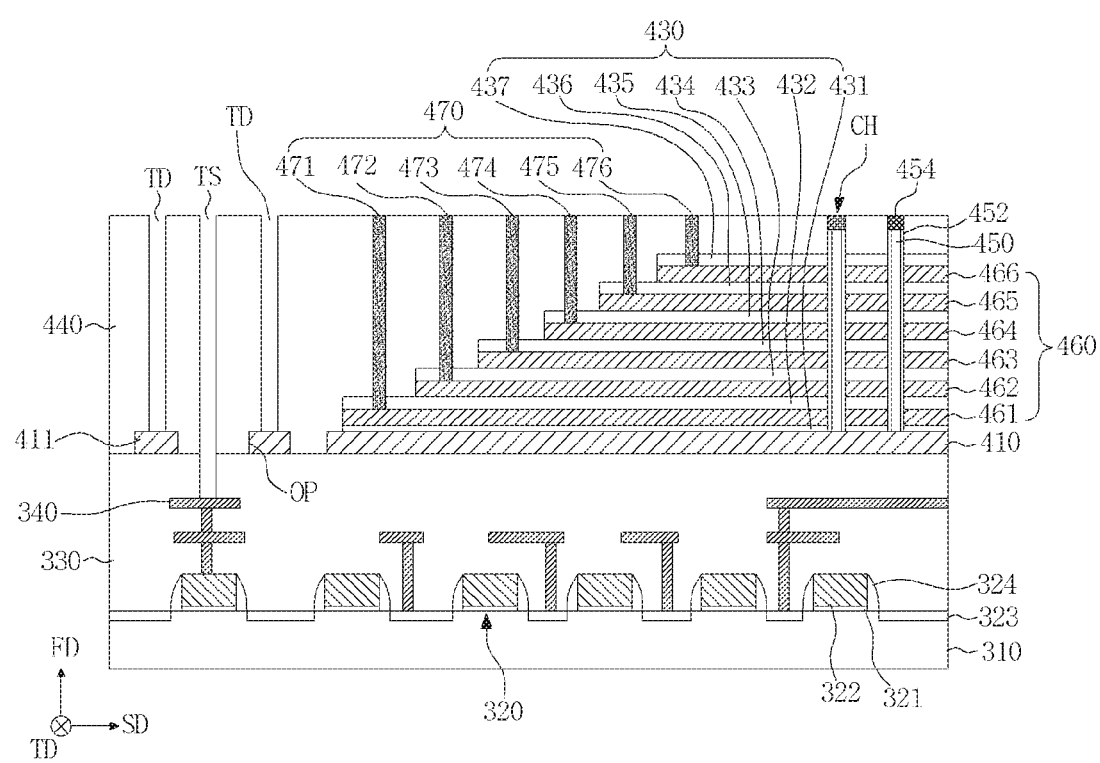

Referring to FIGS. 16A and 16B, in order to form the second contact, a hard mask pattern (not shown) which has an open portion where the second contact is to be formed may be formed on the second dielectric layer 440, and a hole TS which exposes the bottom wiring line 340 may be formed by etching the second dielectric layer 440 and the first dielectric layer 330 of the opened portion of the hard mask pattern.

To increase the degree of integration of the semiconductor memory device, the number of the stacked gate electrode layers 460 is increased, which also increases the thickness of the second dielectric layer 440 increases. Carbon from hydrofluorocarbon which is an etching compound produced during a process of etching the hole TS accumulates in the hole TS during the etching process and is polymerized to form a polymer. The accumulation of the polymer occurs adjacent to the upper sidewall of the hole TS. As the thickness of the second dielectric layer 440 increases and thus an amount of the second dielectric layer 440 to be etched in the process of etching the hole TS increases, an amount of the polymer produced during the process of etching the hole TS increases as well. The polymer is produced less in a portion where a hole pattern density is high, and more where a hole pattern density is low and the distance between adjacent holes is large. Since a second contact 480 is disposed in such a way as to stand alone, a thick polymer layer may accumulate on the upper sidewall of the hole TS during the etching process for forming the hole TS, and the entrance of the hole TS may be clogged by the polymer layer, whereby the flow of an etchant into the hole TS may be blocked. In this case, an opening failure in which the bottom portion of the hole TS is not opened may occur. As a consequence, the second contact 480 (see FIG. 4) may not be electrically coupled to the bottom wiring line 340, and the normal operation of the semiconductor memory device may become impossible. Thus, the reliability of the semiconductor memory device may degrade.

In an embodiment of the present invention, such a problem may be solved by forming additional dummy holes TU in the second dielectric layer 440 adjacent to the hole TS when forming the hole TS. As the dummy holes TU are additionally formed around the hole TS, since a hole pattern density increases in the portion where the hole TS is formed, it is possible to suppress the excessive production of the polymer. Therefore, the phenomenon in which the hole TS is clogged by the polymer is prevented and thus the etchant may be smoothly introduced into the hole TS and the hole opening failure may be prevented.

Figure 17A:
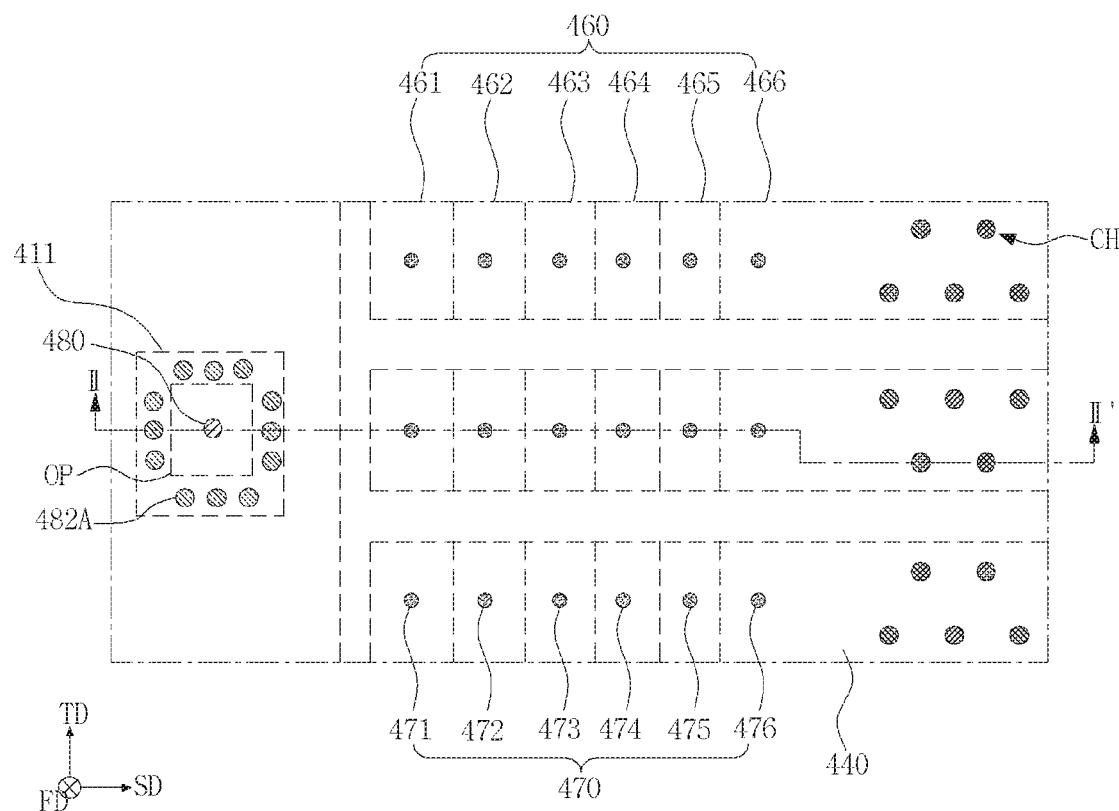
Figure 17B:
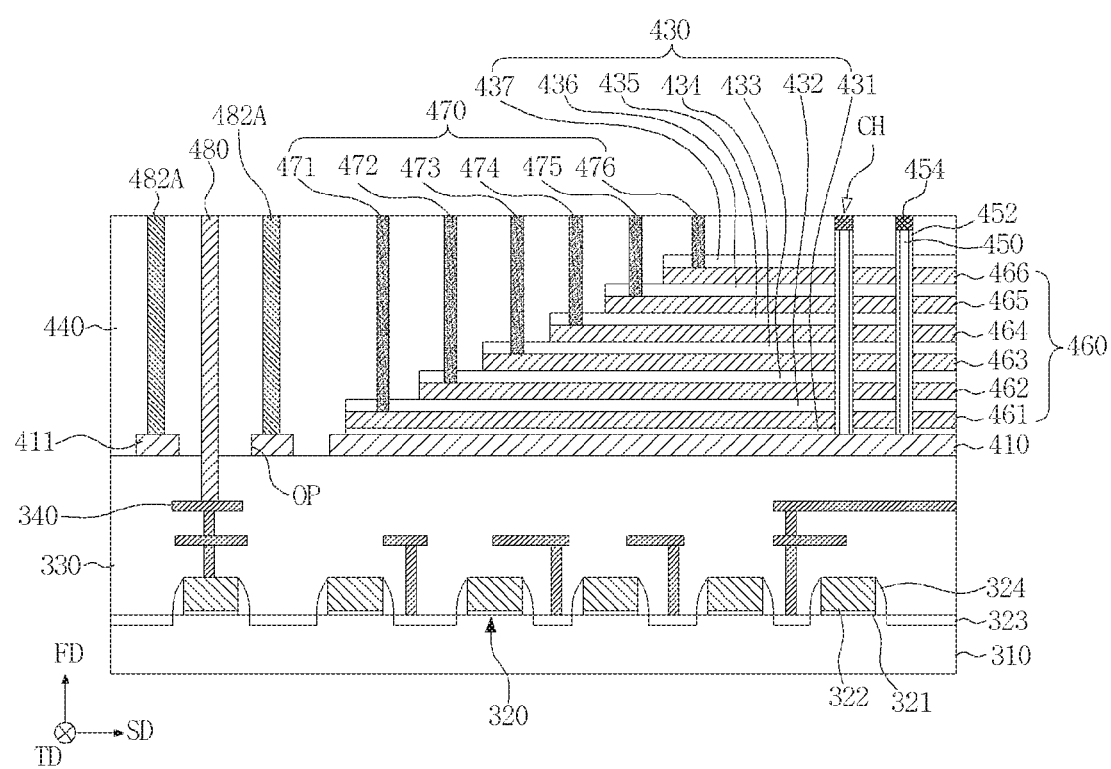

Referring to FIGS. 17A and 17B, by filling a conductive material in the hole TS and in the dummy holes TDTU, the second contact 480 and the dummy contacts 482A are formed. The second contact 480 and the dummy contacts 482A may be formed of the same material. For example, the second contact 480 and the dummy contacts 482A may be made of or include a metal or a metal silicide.

Figure 18:
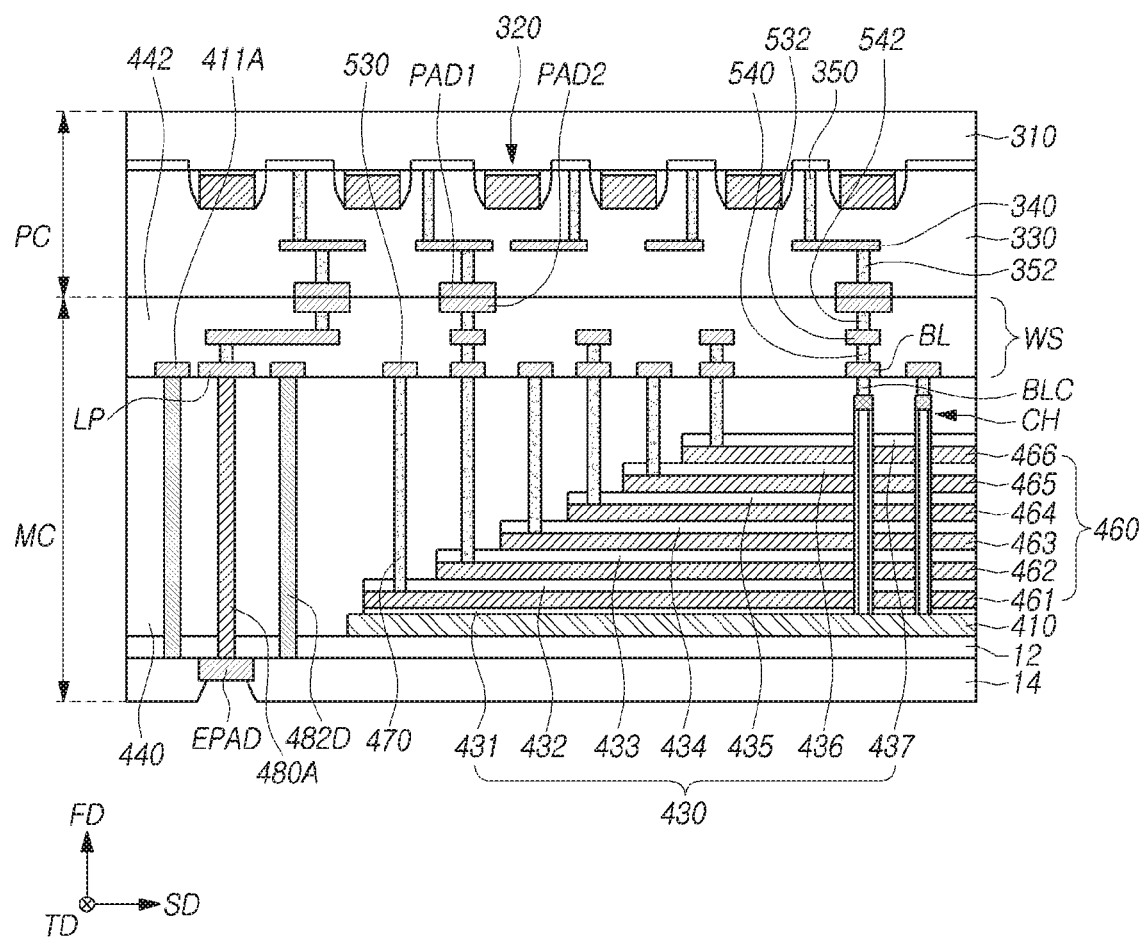
FIG. 18 is a cross-sectional view illustrating a representation of an example of a semiconductor memory device in accordance with an embodiment of the disclosure.
Figure 19:
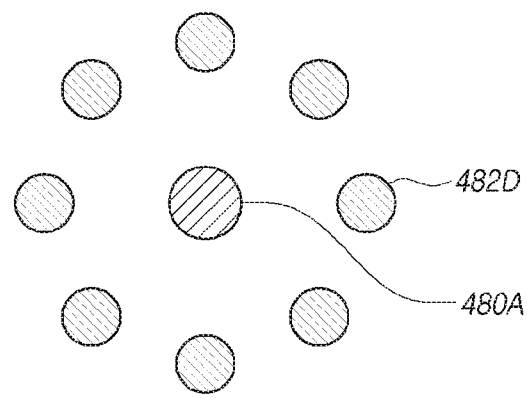
FIG. 19 is a top view illustrating a contact and dummy contacts of FIG. 18.

FIG. 18 is a cross-sectional view illustrating a representation of an example of a semiconductor memory device in accordance with an embodiment of the disclosure, and FIG. 19 is a top view illustrating a contact and dummy contacts of FIG. 18.

Referring to FIG. 18, the semiconductor memory device in accordance with the embodiment of the disclosure may have a POC (peri over cell) structure. That is to say, a circuit chip PC may be disposed over a memory chip MC. The circuit chip PC and the memory chip MC may be manufactured on different wafers and be then bonded. The circuit chip PC and the memory chip MC may be bonded in a wafer state, and after being bonded, may be individualized through a dicing process.

The circuit chip PC may include a first substrate 310 and peripheral circuit elements 320. A dielectric layer 330 may be defined on the first substrate 310 and cover the peripheral circuit elements 320. At least one wiring line layer may be defined in the dielectric layer 330. A plurality of wiring lines 340 may be disposed in the wiring line layer. The respective wiring lines 340 may be coupled to the peripheral circuit elements 320 through conductive vias 350. The circuit chip PC may have a plurality of first pads PAD1 on a bonding surface with the memory chip MC. The respective first pads PAD1 may be coupled to the peripheral circuit elements 320 through conductive vias 352, the wiring lines 340 and the conductive vias 350.

The memory chip MC may include a second substrate 410, a plurality of channel structures CH which are defined on the second substrate 410 and extend in the first direction FD, and a plurality of gate electrode layers 461 to 466: 460 and a plurality of interlayer dielectric layers 431 to 437: 430 which are alternately stacked along the channel structures CH.

Figure 20A:
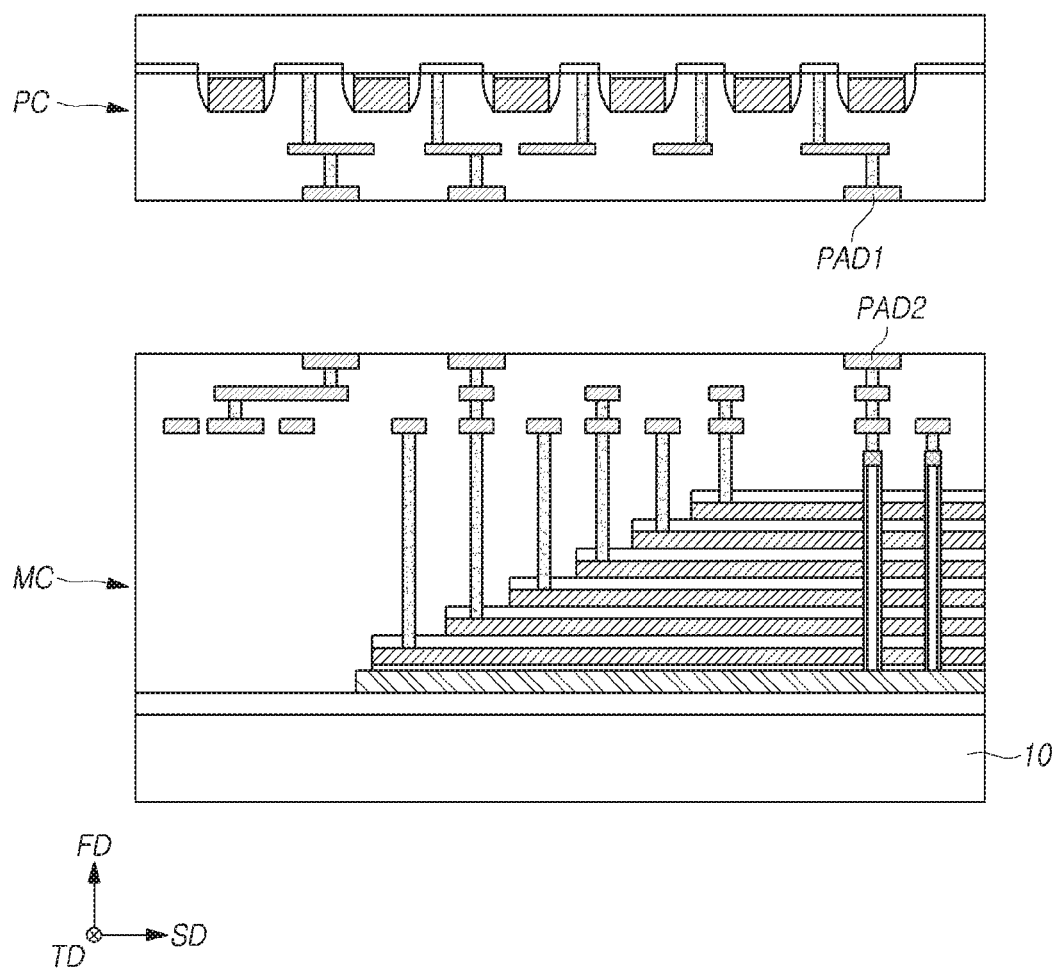
FIGS. 20A to 20C are representations of examples of cross-sectional views to assist in the explanation of a method for manufacturing a semiconductor memory device in accordance with an embodiment of the disclosure.

The second substrate 410 may be disposed on a base dielectric layer 12. As illustrated in FIG. 20A to be described later, the base dielectric layer 12 may be formed on a carrier substrate 10 (see FIG. 20A), and, with the base dielectric layer 12 supported by the carrier substrate 10, the second substrate 410 may be formed on the base dielectric layer 12. The second substrate 410 may be disposed in a center region where the gate electrode layers 460 and the interlayer dielectric layers 430 are positioned, and may not be disposed in an edge region. The second substrate 410 may expose the base dielectric layer 12 of the edge region.

The gate electrode layers 460 may correspond to row lines. The gate electrode layers 460 may extend by different lengths in the second direction SD, and thus, the ends of the gate electrode layers 460 may form a step structure. A dielectric layer 440 may be defined on the base dielectric layer 12, and thereby, may cover the top surfaces and side surfaces of the second substrate 410, the plurality of gate electrode layers 460 and interlayer dielectric layers 430 which are alternately stacked, and the channel structures CH.

A plurality of conductive vias 470 which pass through the dielectric layer 440 in the first direction FD and are coupled to the gate electrode layers 460 may be defined on the step structure of the gate electrode layers 460. A plurality of bit line contacts BLC which pass through the dielectric layer 440 in the first direction FD and are coupled to the channel structures CH, respectively, may be defined on the channel structures CH.

A wiring line structure WS may be defined on the dielectric layer 440. The wiring line structure WS may include a plurality of wiring line layers and a dielectric layer 442. FIG. 18 illustrates a case where the wiring line structure WS includes three wiring line layers. Among the wiring line layers of the wiring line structure WS, a lowermost wiring line layer may be disposed on the dielectric layer 440. The lowermost wiring line layer may include a plurality of local row lines 530, a plurality of bit lines BL and a landing pad LP. The local row lines 530 may be coupled to the conductive vias 470 which are coupled to the gate electrode layers 460. The bit lines BL may be coupled to the bit line contacts BLC. While not illustrated in detail, the bit lines BL may extend in the third direction TD, and be disposed in the second direction SD. The landing pad LP may be disposed in the edge region.

Among the wiring line layers of the wiring line structure WS, an uppermost wiring line layer may include a plurality of second pads PAD2. The second pads PAD2 may be exposed at the top surface of the dielectric layer 442. The top surface of the dielectric layer 442 may be bonded with the circuit chip PC. Each of the second pads PAD2 may be coupled to one of the local row lines 530, the bit lines BL and the landing pad LP through a wiring line 532 and conductive vias 540 and 542.

A contact 480A which passes through the base dielectric layer 12 and the dielectric layer 440 may be defined at one side of the second substrate 410 and the gate electrode layers 460 and interlayer dielectric layers 430 which are alternately stacked. The contact 480A may extend from the back surface of the base dielectric layer 12 in the first direction FD, may pass through the base dielectric layer 12 and the dielectric layer 440, and may be coupled to the landing pad LP on the dielectric layer 440. Due to this fact, the end of the contact 480A may be brought into contact with the landing pad LP.

Dummy contacts 482D may be disposed around the contact 480A. The dummy contacts 482D are formed together with the contact 480A in a process for forming the contact 480A. In other words, by additionally forming holes for dummy contacts around a hole for a contact in a contact hole etching process for forming the contact 480A and filling a conductive material in the holes for dummy contacts in a process of filling a conductive material in the hole for a contact, the contact 480A and the dummy contacts 482D may be formed in batch. The contact 480A and the dummy contacts 482D may be formed of the same material. For example, the contact 480A and the dummy contacts 482D may include a metal or a metal silicide.

FIG. 19 is a top view illustrating a contact and dummy contacts.

Referring to FIG. 19, the plurality of dummy contacts 482D may be arranged around the contact 480A in a form that surrounds the contact 480A. When viewed from the top, each of the dummy contacts 482D may have substantially the same shape as the contact 480A. For example, the contact 480A and the dummy contacts 482D may have a circular or oval shape when viewed from the top. The cross-sectional area of each dummy contact 482D may have substantially the same size as the cross-sectional area of the contact 480A. In the case where the contact 480A and each dummy contact 482D are formed to have the same cross-sectional area, it is possible to suppress etching non-uniformity due to a micro loading effect in the etching process for forming the hole for a contact and the holes for dummy contacts.

Referring again to FIG. 18, etch stoppers 411A may be defined on the dielectric layer 440. In the present embodiment, the dummy contacts 482D may extend from the back surface of the base dielectric layer 12 in the first direction FD, may pass through the base dielectric layer 12 and the dielectric layer 440, and may be coupled to the etch stoppers 411A which are defined on the dielectric layer 440. Due to this fact, the ends of the dummy contacts 482D may be brought into contact with the etch stoppers 411A.

The etch stoppers 411A may include a material which has a predetermined etching selectivity with respect to the base dielectric layer 12 and the dielectric layer 440. For instance, the base dielectric layer 12 and the dielectric layer 440 may be formed of at least one of a silicon oxide and a silicon nitride, and the etch stoppers 411A may be formed of a metal. In the present embodiment, the etch stoppers 411A may be formed at the same processing step as the landing pad LP. The etch stoppers 411A may be formed of the same material as the landing pad LP, for example, copper, aluminum or tungsten.

In the etching process for forming the hole for a contact and the holes for dummy contacts, etching of the holes for dummy contacts is stopped by the etch stoppers 411A. Due to this fact, the holes for dummy contacts may not extend to wiring lines inside the wiring line structure WS of the memory chip MC and the wiring lines 340 and the peripheral circuit elements 320 of the circuit chip PC. Namely, the etch stopper 411A may prevent a short circuit from occurring as the dummy contacts 482D are coupled with wiring lines associated with the operation of the semiconductor memory device and the peripheral circuit elements 320.

An external connection pad EPAD may be defined on the back surface, that is, a surface facing away from a surface which faces the second substrate 410 and the dielectric layer 440, of the base dielectric layer 12, and may be coupled with the contact 480A. The external connection pad EPAD may correspond to a contact of the semiconductor memory device for electrical connection with an external device. While FIG. 18 illustrates only one external connection pad EPAD, it is to be understood that a plurality of external connection pads EPAD are provided in the semiconductor memory device. The external connection pad EPAD may be connected to a mounting substrate or another semiconductor device through a connection member such as a solder ball, a conductive bump or a wire. A passivation layer 14 may be defined on the back surface of the base dielectric layer 12 to cover the dummy contacts 482D and expose the external connection pad EPAD.

Hereinbelow, a manufacturing process of the semiconductor memory device illustrated in FIG. 18 will be described with reference to FIGS. 20A to 20C.

Figure 20B:
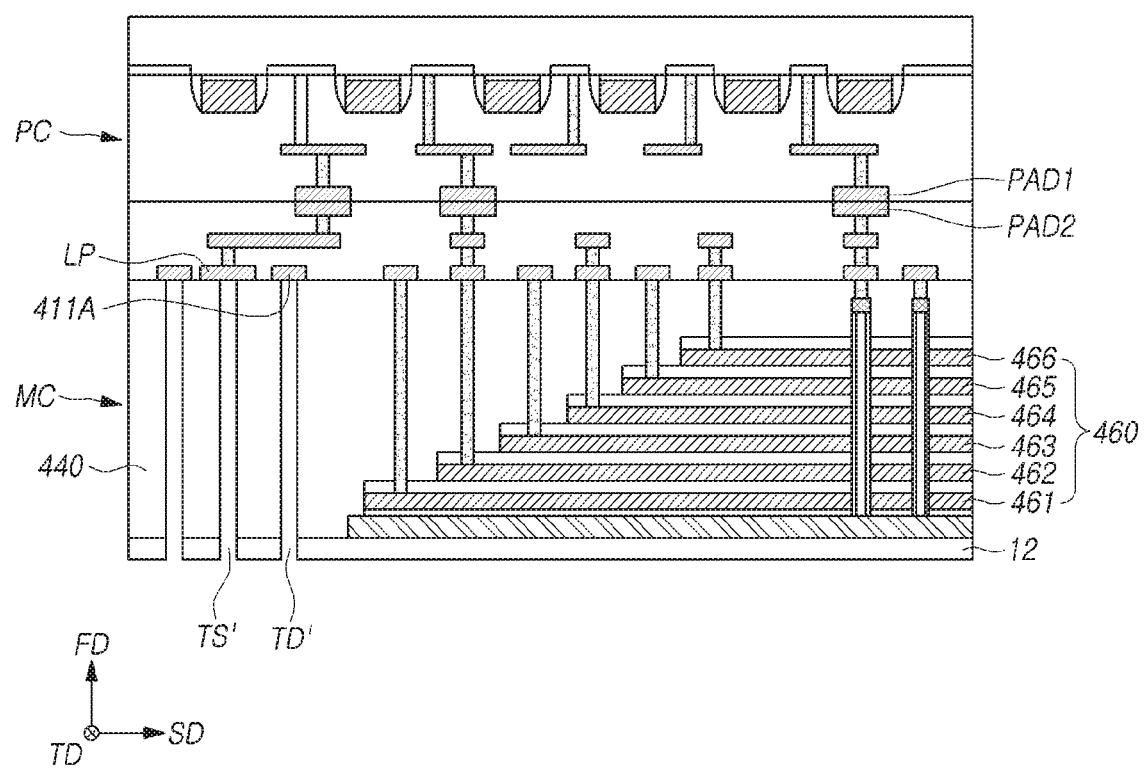
Figure 20C:
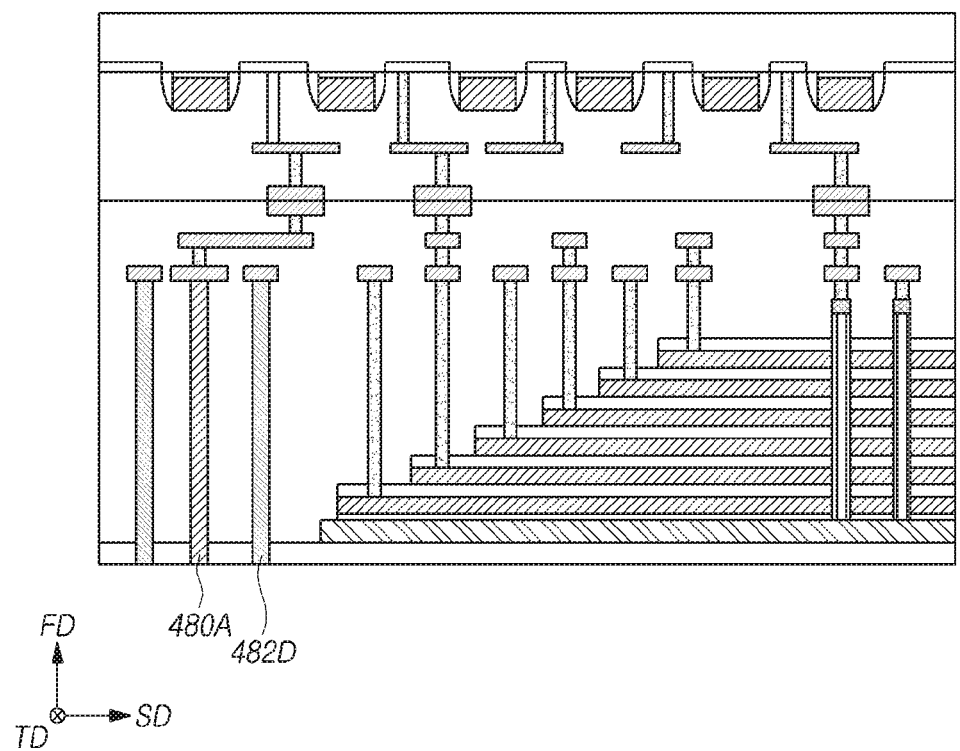

FIGS. 20A to 20C are representations of examples of cross-sectional views to assist in the explanation of a method for manufacturing a semiconductor memory device in accordance with an embodiment of the disclosure.

FIG. 20A illustrates the memory chip MC and the circuit chip PC before bonding. Referring to FIG. 20A, the memory chip MC may be formed on the carrier substrate 10. The circuit chip PC may be manufactured separately from the memory chip MC.

Referring to FIG. 20B, the circuit chip PC may have the plurality of first pads PAD1 on one surface thereof, and the memory chip MC may have the plurality of second pads PAD2 on one surface thereof. The one surface of the memory chip MC and the one surface of the circuit chip PC may be bonded with each other such that the first pads PAD1 and the second pads PAD2 corresponding to each other may be coupled with each other. While not illustrated, in the bonding process, metals may be disposed on the first pads PAD1 and the second pads PAD2, and as the bonding metal on the first pads PAD1 and the bonding metal on the second pads PAD2 are bonded with each other, the first pads PAD1 of the circuit chip PC and the second pads PAD2 of the memory chip MC may be coupled with each other.

The carrier substrate 10 may be removed after the memory chip MC and the circuit chip PC are bonded. The carrier substrate 10 may be removed by a wet etching process using a nitric acid. From the surface from which the carrier substrate 10 is removed, a hole TS' which reaches the landing pad LP through the base dielectric layer 12 and the dielectric layer 440 and dummy holes DS' which reach the etch stoppers 411A through the base dielectric layer 12 and the dielectric layer 440 may be formed.

As the stack number of the gate electrode layers 460 is increased due to an increase in the degree of integration of a semiconductor memory device, the thickness of the dielectric layer 440 increases. Carbon from hydrofluorocarbon which is an etching compound produced during a process of etching the hole TS' accumulates in the hole TS' during the etching process, and is polymerized to form a polymer. The accumulation of the polymer mainly occurs on the sidewall of the hole TS' adjacent to the entrance thereof. As a thickness of the dielectric layer 440 increases and thus an amount of an object to be etched during the process of etching the hole TS' increases, an amount of the polymer produced during the process of etching the hole TS' increases as well. The polymer is produced less in a region where a hole pattern density is high, but a large amount of polymer may be produced in the case where a hole pattern density is low and a distance from an adjacent hole is long. The contact 480D (see FIG. 18) for electrically coupling the external connection pad EPAD (see FIG. 18) and the peripheral circuit element 320 is not large in the number thereof, and is disposed at a low density since it is distant from another adjacent contact. Due to this fact, a thick polymer layer may accumulate on the sidewall of the hole TS' adjacent to the entrance thereof during the etching process for forming the hole TS', and the entrance of the hole TS' may be clogged by the polymer layer, whereby the flow of an etchant into the hole TS' may be blocked. In this case, an open failure problem may occur in that a bottom portion of the hole TS' is not open. Accordingly, as the contact 480D (see FIG. 18) is not coupled to the landing pad LP, it may be impossible to perform a normal operation.

In the present embodiment, such a problem may be solved by additionally forming the dummy holes TD' around the hole TS' when forming the hole TS'. By additionally forming the dummy holes TD' around the hole TS', since a density of an object to be etched increases, it is possible to suppress excessive production of polymer. Therefore, since a phenomenon in which the hole TS' is clogged by the polymer is prevented and thus the etchant may be smoothly introduced into the hole TS', the hole open failure may be prevented.

Referring to FIG. 20C, by filling a conductive material in the hole TS' and the dummy holes TD', the contact 480A and the dummy contacts 482D may be formed. The contact 480A and the dummy contacts 482D may be formed of the same material. For example, the contact 480A and the dummy contacts 482D may include a metal or a metal silicide.

Referring again to FIG. 18, the external connection pad EPAD may be formed on the other surface of the base dielectric layer 12 facing away from the one surface of the base dielectric layer 12 on which the second substrate 410 is positioned, and may be coupled with the contact 480A. Then, the passivation layer 14 may be formed on the back surface of the base dielectric layer 12 to cover the dummy contacts 482D and expose the external connection pad EPAD.

Figure 21:
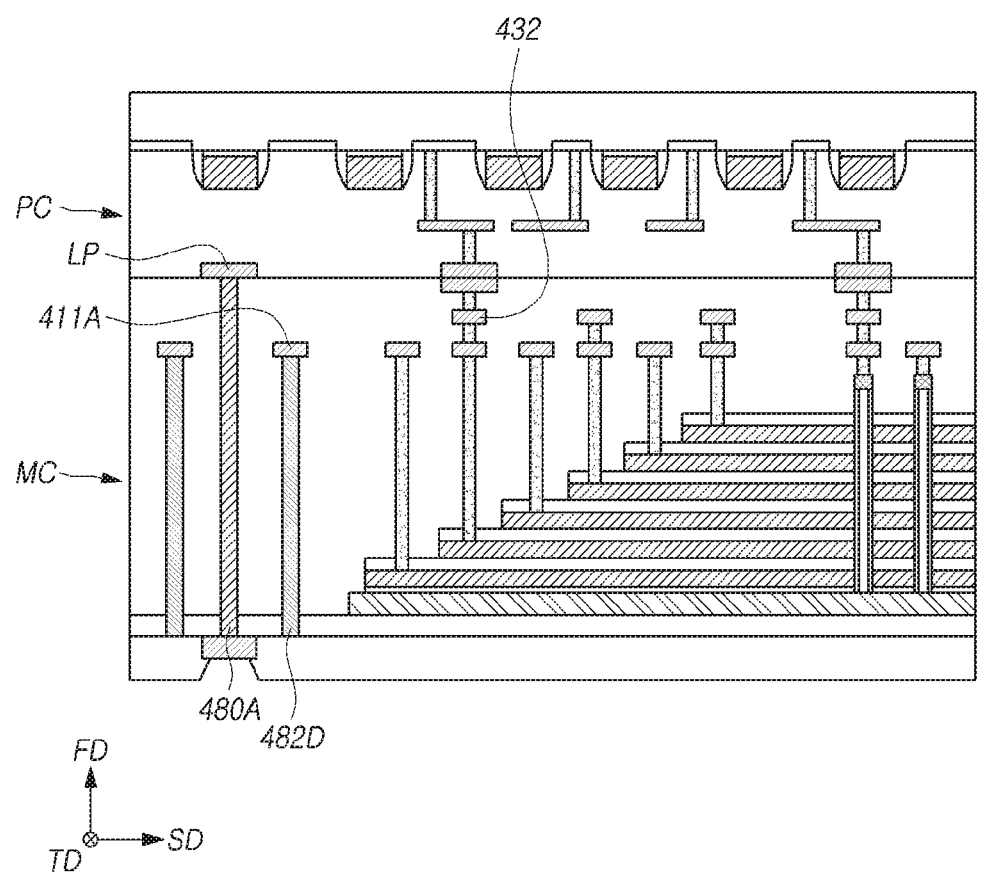
FIGS. 21 and 22 are cross-sectional views illustrating various embodiments of the disclosure.
Figure 22:
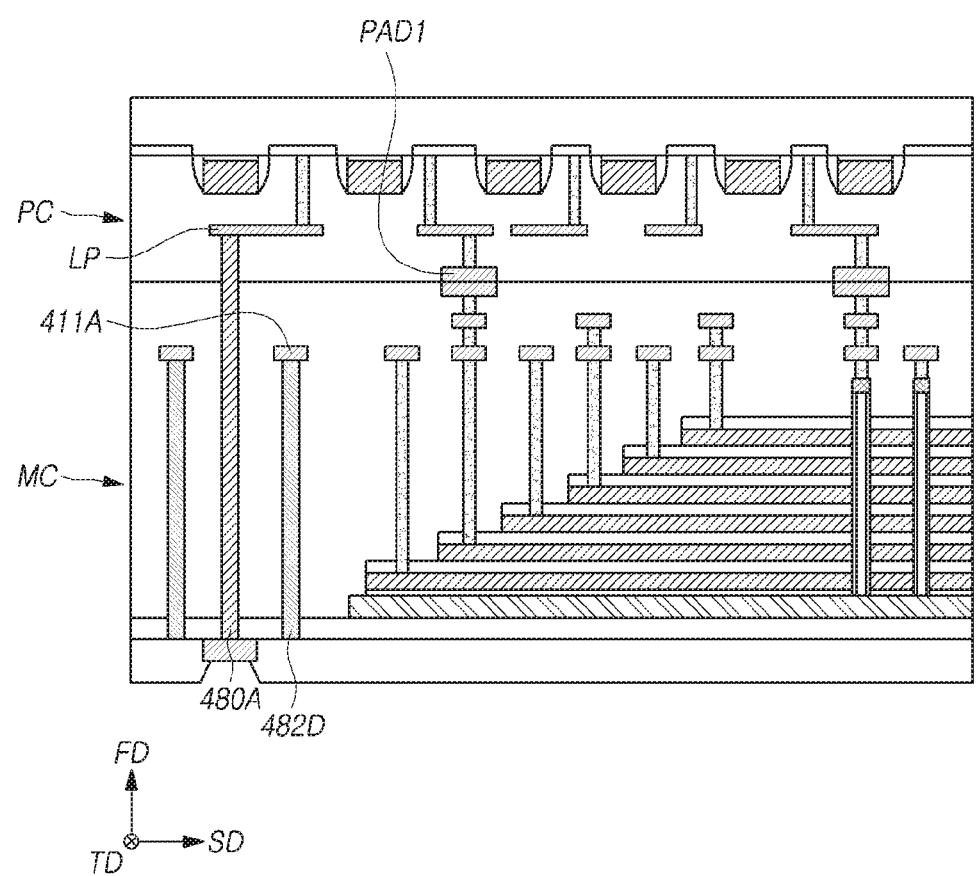

FIGS. 21 and 22 are cross-sectional views illustrating various embodiments of the disclosure.

While a case where the landing pad LP and the etch stoppers 411A are disposed at the same layer is illustrated in the embodiment described above with reference to FIG. 18, the disclosure is not limited thereto. For example, as illustrated in FIG. 21, the etch stoppers 411A may be disposed at the same layer as the bit lines BL, and the landing pad LP may be disposed at the same layer as the first pads PAD1 of the circuit chip PC. In this case, the contact 480A may pass through the base dielectric layer 12, the dielectric layer 440 and the dielectric layer 442, and a height of the contact 480A may be higher than a height of the dummy contacts 482D.

As illustrated in FIG. 22, the landing pad LP may be disposed at the same layer as the wiring lines 340 of the circuit chip PC. In other words, the landing pad LP may be disposed inside the dielectric layer 330 of the circuit chip PC. The landing pad LP may be formed together with the wiring lines 340 of the circuit chip PC at the processing step of forming the wiring lines 340 of the circuit chip PC.

As illustrated in FIGS. 21 and 22, if the landing pad LP is disposed in the circuit chip PC, since it is not necessary to form a separate wiring line in the memory chip MC to couple the landing pad LP and the circuit chip PC, the number of wiring lines included in the memory chip MC may be reduced.

Figure 23:
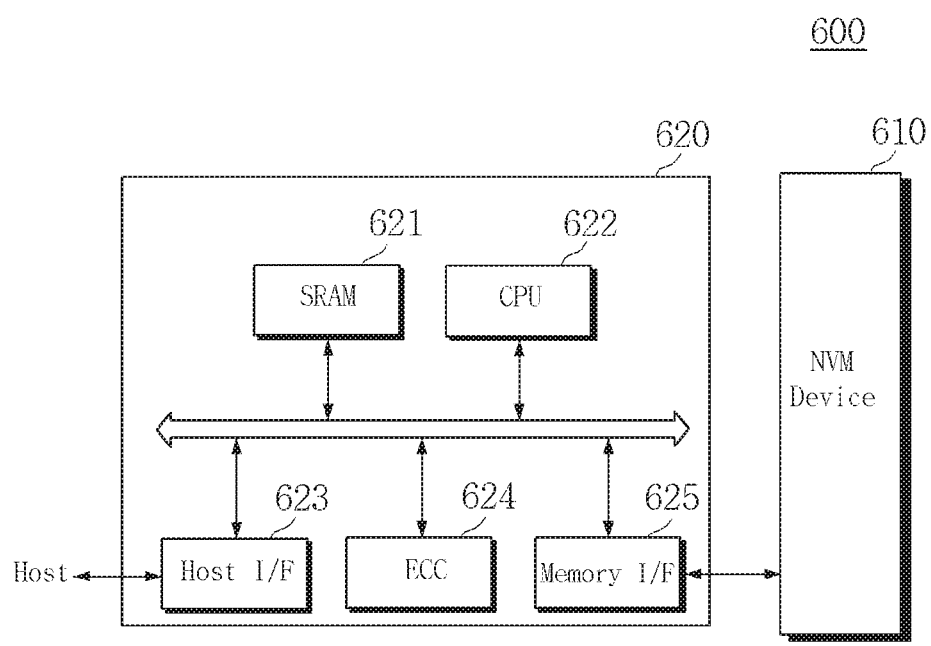
FIG. 23 is a simplified block diagram schematically illustrating a memory system including a semiconductor memory device in accordance with an embodiment of the present invention.

FIG. 23 is a simplified block diagram schematically illustrating a memory system including a memory device according to an embodiment of the present invention.

Referring to FIG. 23, the memory system 600 may include the semiconductor memory device 610 and a memory controller 620.

The semiconductor memory device 610 may be comprised the memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid state disk (SSD). The memory controller 620 may include an SRAM 621, a central processing unit (CPU) 622, a host interface 623, an ECC block 624, and a memory interface 625 operatively coupled via an internal bus.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 24:
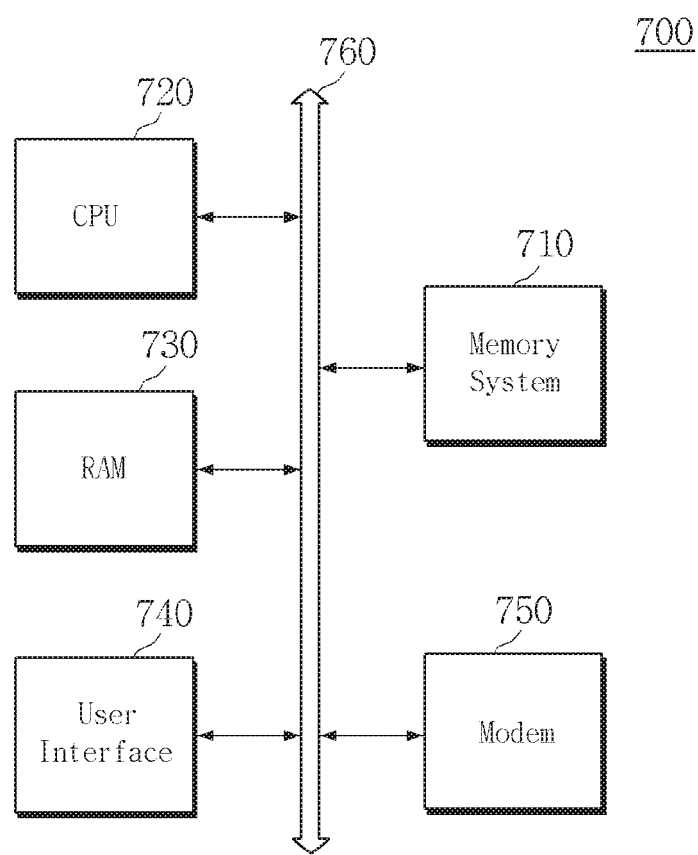
FIG. 24 is a simplified block diagram schematically illustrating a computing system including a semiconductor memory device in accordance with an embodiment of the present invention.

FIG. 24 is a simplified block diagram schematically illustrating a computing system including a memory device, according to an embodiment of the present invention.

Referring to FIG. 24, a computing system 700 according to an embodiment may include a memory system 710, a microprocessor (or CPU) 720, a RAM 730, a user interface 740, a modem 750 such as a baseband chipset, and, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory (for example, a NAND or a NOR flash memory).

We also note, that it is not intended that the above-described embodiments are realized only by a device and a method, and that they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
    a circuit chip including a first substrate, peripheral circuit elements which are defined on the first substrate, a first dielectric layer which covers the peripheral circuit elements, and a plurality of first pads which are coupled to the peripheral circuit elements, on one surface thereof;
    a memory chip including a second substrate which is disposed on a base dielectric layer, a memory cell array which is defined on the second substrate, a second dielectric layer which covers the memory cell array, and a plurality of second pads which are coupled with the first pads, on one surface thereof which is bonded with the one surface of the circuit chip;
    a contact passing through the base dielectric layer and the second dielectric layer; and
    one or more dummy contacts passing through the base dielectric layer and the second dielectric layer, and disposed around the contact.

2. The semiconductor memory device according to claim 1, wherein the contact and the dummy contacts are formed of the same material.

3. The semiconductor memory device according to claim 1, wherein an area of each dummy contact and an area of the contact are the same with each other when viewed from the top.

4. The semiconductor memory device according to claim 1, wherein the memory chip further includes a plurality of bit lines which are disposed on the second dielectric layer and are coupled with the memory cell array.

5. The semiconductor memory device according to claim 1, further comprising:
    a landing pad brought into contact with an end of the contact, the landing pad being disposed on the second dielectric layer.

6. The semiconductor memory device according to claim 1, further comprising:
    a landing pad brought into contact with an end of the contact, the landing pad being disposed at the same layer as the first pads of the circuit chip.

7. The semiconductor memory device according to claim 1, further comprising:
    a landing pad brought into contact with an end of the contact, the landing pad being disposed inside the first dielectric layer.

8. The semiconductor memory device according to claim 1, wherein the second substrate is disposed on a portion of the base dielectric layer, and the contact and the dummy contacts pass through the base dielectric layer and the second dielectric layer in a region where the second substrate is not positioned.

9. The semiconductor memory device according to claim 7, further comprising:
    an external connection pad disposed on the other surface of the base dielectric layer facing away from one surface of the base dielectric layer which is brought into contact with the second substrate, and coupled with the contact.

10. The semiconductor memory device according to claim 1, further comprising:
    etch stoppers disposed on the second dielectric layer, and brought into contact with ends of the dummy contacts.

11. The semiconductor memory device according to claim 10, wherein the etch stoppers are formed of a material which has a different etching selectivity from the second dielectric layer.

12. A semiconductor memory device comprising:
    peripheral circuit elements defined on a first substrate;
    a first dielectric layer covering the peripheral circuit elements;
    a plurality of first pads exposed at a top surface of the first dielectric layer, and coupled with the peripheral circuit elements;
    a second substrate disposed on a base dielectric layer;
    a memory cell array defined on the second substrate;
    a second dielectric layer covering the second substrate and the memory cell array;
    a third dielectric layer disposed on the second dielectric layer, and having one surface which is bonded with the top surface of the first dielectric layer;
    a plurality of second pads exposed at the one surface of the third dielectric layer, and coupled with the first pads;
    a contact passing through the base dielectric layer and the second dielectric layer; and
    one or more dummy contacts passing through the base dielectric layer and the second dielectric layer, and disposed around the contact.

13. The semiconductor memory device according to claim 12, wherein the contact and the dummy contacts are formed of the same material.

14. The semiconductor memory device according to claim 12, wherein an area of each dummy contact and an area of the contact are the same with each other when viewed from the top.

15. The semiconductor memory device according to claim 12, further comprising:
  a landing pad brought into contact with an end of the contact, the landing pad being disposed on the second dielectric layer.

16. The semiconductor memory device according to claim 2, further comprising:
  a landing pad brought into contact with an end of the contact,
  wherein the landing pad is disposed at the same layer as the first pads of the circuit chip, and the contact passes through the third dielectric layer.

17. The semiconductor memory device according to claim 12, further comprising:
  a landing pad brought into contact with an end of the contact,
  wherein the landing pad is disposed inside the first dielectric layer, and the contact passes through the third dielectric layer and a portion of the first dielectric layer.

18. The semiconductor memory device according to claim 12, further comprising:
  an external connection pad disposed on the other surface of the base dielectric layer facing away from one surface of the base dielectric layer which is brought into contact with the second substrate, and coupled with the contact.

19. The semiconductor memory device according to claim 12, further comprising:
  etch stoppers disposed on the second dielectric layer, and coupled with ends of the dummy contacts.

20. The semiconductor memory device according to claim 12, wherein the memory cell array comprises:
  a plurality of channel structures defined on the second substrate; and
  a plurality of gate electrode layers and a plurality of interlayer dielectric layers alternately stacked along the channel structures.

\* \* \* \* \*